(12) United States Patent
Xu

(10) Patent No.: US 8,072,402 B2
(45) Date of Patent: Dec. 6, 2011

(54) INTERFEROMETRIC OPTICAL MODULATOR WITH BROADBAND REFLECTION CHARACTERISTICS

(75) Inventor: Gang Xu, Cupertino, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 971 days.

(21) Appl. No.: 11/847,205

(22) Filed: Aug. 29, 2007

(65) Prior Publication Data
US 2009/0059346 A1 Mar. 5, 2009

(51) Int. Cl.
*G09G 3/34* (2006.01)
(52) U.S. Cl. ............ 345/84; 345/85; 356/517; 359/291; 359/298
(58) Field of Classification Search .............. 345/84, 345/85, 108, 204; 356/517; 359/108, 237, 359/238, 240, 245, 246, 251, 254, 291, 298, 359/320
See application file for complete search history.

(56) References Cited

U.S. PATENT DOCUMENTS

| | | | |
|---|---|---|---|
| 2,518,647 A | 8/1950 | Teeple et al. | |
| 3,656,836 A | 4/1972 | de Cremoux et al. | |
| 3,728,030 A | 4/1973 | Hawes | |
| 3,955,190 A | 5/1976 | Teraishi | |
| 4,377,324 A | 3/1983 | Durand | |
| 4,403,248 A | 9/1983 | te Velde | |
| 4,441,791 A | 4/1984 | Hornbeck | |
| 4,459,182 A | 7/1984 | Te Velde | |
| 4,566,935 A | 1/1986 | Hornbeck | |
| 4,596,992 A | 6/1986 | Hornbeck | |
| 4,615,595 A | 10/1986 | Hornbeck | |
| 4,662,746 A | 5/1987 | Hornbeck | |
| 4,705,361 A | 11/1987 | Frazier et al. | |
| 4,710,732 A | 12/1987 | Hornbeck | |
| 4,786,128 A | 11/1988 | Birnbach | |
| 4,822,993 A | 4/1989 | Dillon et al. | |
| 4,859,060 A | 8/1989 | Katagiri et al. | |
| 4,954,789 A | 9/1990 | Sampsell | |
| 4,956,619 A | 9/1990 | Hornbeck | |
| 4,982,184 A | 1/1991 | Kirkwood | |

(Continued)

FOREIGN PATENT DOCUMENTS

DE     102 28 946     1/2004

(Continued)

OTHER PUBLICATIONS

Conner, "Hybrid Color Display Using Optical Interference Filter Array," SID Digest, pp. 577-580 (1993).

(Continued)

*Primary Examiner* — Kimnhung Nguyen
(74) *Attorney, Agent, or Firm* — Knobbe, Martens, Olson and Bear, LLP

(57) ABSTRACT

An optical device suitable for forming a pixel in a video display. The optical device includes a first layer having a first refractive index; a second layer over the first layer, the second layer having a second refractive index less than the first refractive index; and a third layer over the second layer, the third layer having a third refractive index larger than the second refractive index; and a fourth layer that is at least partially optically absorptive, wherein the optical stack and the fourth layer are a first distance from one another when the device is in a first state and are a second distance from one another when the device is in a second state, the first distance different from the second distance.

31 Claims, 19 Drawing Sheets

U.S. PATENT DOCUMENTS

| | | |
|---|---|---|
| 4,985,312 A | 1/1991 | Furuya et al. |
| 5,022,745 A | 6/1991 | Zahowski et al. |
| 5,028,939 A | 7/1991 | Hornbeck et al. |
| 5,061,049 A | 10/1991 | Hornbeck |
| 5,091,983 A | 2/1992 | Lukosz |
| 5,096,279 A | 3/1992 | Hornbeck et al. |
| 5,151,585 A | 9/1992 | Seibert |
| 5,315,370 A | 5/1994 | Bulow |
| 5,381,232 A | 1/1995 | Van Wijk |
| 5,500,761 A | 3/1996 | Goosen et al. |
| 5,526,172 A | 6/1996 | Kanack |
| 5,559,358 A | 9/1996 | Burns et al. |
| 5,578,976 A | 11/1996 | Yao |
| 5,636,052 A | 6/1997 | Arney et al. |
| 5,646,729 A | 7/1997 | Koskinen et al. |
| 5,646,768 A | 7/1997 | Kaeiyama |
| 5,654,819 A | 8/1997 | Goossen et al. |
| 5,661,592 A | 8/1997 | Bornstein et al. |
| 5,665,997 A | 9/1997 | Weaver et al. |
| 5,710,656 A | 1/1998 | Goosen |
| 5,757,536 A | 5/1998 | Ricco et al. |
| 5,786,927 A | 7/1998 | Greywall et al. |
| 5,808,781 A | 9/1998 | Arney et al. |
| 5,818,095 A | 10/1998 | Sampsell |
| 5,825,528 A | 10/1998 | Goosen |
| 5,835,255 A | 11/1998 | Miles |
| 5,838,484 A | 11/1998 | Goossen et al. |
| 5,853,310 A | 12/1998 | Nishimura |
| 5,867,302 A | 2/1999 | Fleming |
| 5,914,803 A | 6/1999 | Hwang et al. |
| 5,914,804 A | 6/1999 | Goossen |
| 5,920,421 A | 7/1999 | Choi |
| 5,986,796 A | 11/1999 | Miles |
| 6,028,689 A | 2/2000 | Michalicek et al. |
| 6,031,653 A | 2/2000 | Wang |
| 6,038,056 A | 3/2000 | Florence et al. |
| 6,040,937 A | 3/2000 | Miles |
| 6,046,840 A | 4/2000 | Huibers |
| 6,055,090 A | 4/2000 | Miles |
| 6,088,102 A | 7/2000 | Manhart |
| 6,211,976 B1 | 4/2001 | Popovich |
| 6,282,010 B1 | 8/2001 | Sulzbach |
| 6,301,000 B1 | 10/2001 | Johnson |
| 6,323,987 B1 | 11/2001 | Rinuado |
| 6,327,071 B1 | 12/2001 | Kimura |
| 6,356,378 B1 | 3/2002 | Huibers |
| 6,384,952 B1 | 5/2002 | Clark et al. |
| 6,400,738 B1 | 6/2002 | Tucker |
| 6,433,917 B1 | 8/2002 | Mei et al. |
| 6,438,282 B1 | 8/2002 | Takeda et al. |
| 6,447,126 B1 | 9/2002 | Hornbeck |
| 6,452,712 B2 | 9/2002 | Atobe et al. |
| 6,466,354 B1 | 10/2002 | Gudeman |
| 6,574,033 B1 | 6/2003 | Chui et al. |
| 6,597,490 B2 | 7/2003 | Tayebati |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,760,146 B2 | 7/2004 | Ikeda et al. |
| 6,768,522 B2 | 7/2004 | Yasukawa et al. |
| 6,768,555 B2 | 7/2004 | Chen |
| 6,794,119 B2 | 9/2004 | Miles |
| 6,822,780 B1 | 11/2004 | Long |
| 6,841,081 B2 | 1/2005 | Chang et al. |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,903,487 B2 | 6/2005 | Shreeve et al. |
| 6,912,022 B2 | 6/2005 | Lin et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,970,031 B1 | 11/2005 | Martin |
| 6,980,350 B2 | 12/2005 | Hung et al. |
| 6,982,820 B2 | 1/2006 | Tsai |
| 6,995,890 B2 | 2/2006 | Lin et al. |
| 6,999,225 B2 | 2/2006 | Lin et al. |
| 6,999,236 B2 | 2/2006 | Lin et al. |
| 7,006,272 B2 | 2/2006 | Tsai |
| 7,016,095 B2 | 3/2006 | Lin |
| 7,038,752 B2 | 5/2006 | Lin |
| 7,099,058 B2 | 8/2006 | Takemori et al. |
| 7,113,339 B2 | 9/2006 | Taguchi et al. |
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,138,984 B1 | 11/2006 | Miles |
| 7,184,202 B2 | 2/2007 | Miles et al. |
| 7,198,973 B2 | 4/2007 | Lin et al. |
| 7,221,495 B2 | 5/2007 | Miles et al. |
| 7,236,284 B2 | 6/2007 | Miles |
| 7,304,784 B2 | 12/2007 | Chui |
| 7,321,457 B2 | 1/2008 | Heald |
| 7,324,248 B2 | 1/2008 | Brotherton-Ratcliffe et al. |
| 7,342,705 B2 * | 3/2008 | Chui et al. ............ 359/237 |
| 7,355,780 B2 | 4/2008 | Chui |
| 7,369,294 B2 | 5/2008 | Gally |
| 7,417,735 B2 | 8/2008 | Cummings |
| 7,417,784 B2 | 8/2008 | Sasagawa |
| 7,498,621 B2 | 3/2009 | Seitz |
| 7,508,571 B2 | 3/2009 | Gally |
| 7,515,336 B2 | 4/2009 | Lippey |
| 7,561,323 B2 | 7/2009 | Gally |
| 7,564,612 B2 | 7/2009 | Chui |
| 7,630,123 B2 | 12/2009 | Kothari |
| 7,643,203 B2 | 1/2010 | Gousev et al. |
| 7,710,632 B2 | 5/2010 | Cummings |
| 7,710,636 B2 | 5/2010 | Chui |
| 7,855,824 B2 | 12/2010 | Gally |
| 7,855,827 B2 | 12/2010 | Xu et al. |
| 7,898,521 B2 | 3/2011 | Gally |
| 7,907,319 B2 | 3/2011 | Miles |
| 7,911,428 B2 | 3/2011 | Gally |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0015215 A1 | 2/2002 | Miles |
| 2002/0024711 A1 | 2/2002 | Miles |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kurdle et al. |
| 2002/0149828 A1 | 10/2002 | Miles |
| 2003/0016428 A1 | 1/2003 | Kato et al. |
| 2003/0035196 A1 | 2/2003 | Walker |
| 2003/0043157 A1 | 3/2003 | Miles |
| 2003/0053078 A1 | 3/2003 | Missey et al. |
| 2003/0072070 A1 | 4/2003 | Miles |
| 2003/0099118 A1 | 5/2003 | Saitoh |
| 2003/0202265 A1 | 10/2003 | Reboa et al. |
| 2003/0202266 A1 | 10/2003 | Ring et al. |
| 2003/0206281 A1 | 11/2003 | Jain |
| 2003/0214621 A1 | 11/2003 | Kim |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 * | 2/2004 | Ishikawa ............ 359/883 |
| 2004/0043552 A1 | 3/2004 | Strumpell et al. |
| 2004/0051929 A1 | 3/2004 | Sampsell et al. |
| 2004/0058532 A1 | 3/2004 | Miles et al. |
| 2004/0066477 A1 | 4/2004 | Morimoto |
| 2004/0070569 A1 | 4/2004 | Muthuswamy |
| 2004/0075967 A1 | 4/2004 | Lynch et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0109305 A1 | 6/2004 | Chisholm |

| | | |
|---|---|---|
| 2004/0125281 A1 | 7/2004 | Lin et al. |
| 2004/0125282 A1 | 7/2004 | Lin et al. |
| 2004/0141113 A1 | 7/2004 | Yun |
| 2004/0145811 A1 | 7/2004 | Lin et al. |
| 2004/0147198 A1 | 7/2004 | Lin et al. |
| 2004/0175577 A1 | 9/2004 | Lin et al. |
| 2004/0188599 A1 | 9/2004 | Viktorovitch |
| 2004/0207897 A1 | 10/2004 | Lin |
| 2004/0209195 A1 | 10/2004 | Lin |
| 2004/0217264 A1 | 11/2004 | Wood |
| 2004/0217919 A1 | 11/2004 | Pichi et al. |
| 2004/0218251 A1 | 11/2004 | Piehl et al. |
| 2004/0240032 A1 | 12/2004 | Miles |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046919 A1* | 3/2005 | Taguchi et al. ............. 359/237 |
| 2005/0046922 A1 | 3/2005 | Lin et al. |
| 2005/0046948 A1 | 3/2005 | Lin |
| 2005/0078348 A1 | 4/2005 | Lin |
| 2005/0146897 A1 | 7/2005 | Mimura |
| 2005/0168849 A1 | 8/2005 | Lin |
| 2005/0179378 A1 | 8/2005 | Oooka et al. |
| 2005/0195462 A1 | 9/2005 | Lin |
| 2005/0219218 A1 | 10/2005 | Harman |
| 2005/0249966 A1 | 11/2005 | Tung et al. |
| 2006/0007517 A1 | 1/2006 | Tsai |
| 2006/0017379 A1 | 1/2006 | Su et al. |
| 2006/0024880 A1 | 2/2006 | Chui et al. |
| 2006/0044291 A1 | 3/2006 | Willis |
| 2006/0065940 A1 | 3/2006 | Kothari |
| 2006/0066599 A1 | 3/2006 | Chui |
| 2006/0066640 A1 | 3/2006 | Kothari et al. |
| 2006/0066641 A1 | 3/2006 | Gally et al. |
| 2006/0066935 A1 | 3/2006 | Cummings et al. |
| 2006/0066936 A1 | 3/2006 | Chui et al. |
| 2006/0067643 A1 | 3/2006 | Chui |
| 2006/0067649 A1 | 3/2006 | Tung et al. |
| 2006/0067651 A1 | 3/2006 | Chui |
| 2006/0077152 A1 | 4/2006 | Chui et al. |
| 2006/0077153 A1 | 4/2006 | Cummings |
| 2006/0077155 A1 | 4/2006 | Chui et al. |
| 2006/0077156 A1 | 4/2006 | Chui et al. |
| 2006/0077507 A1 | 4/2006 | Chui et al. |
| 2006/0077508 A1 | 4/2006 | Chui et al. |
| 2006/0077515 A1 | 4/2006 | Cummings |
| 2006/0077516 A1 | 4/2006 | Kothari |
| 2006/0079048 A1 | 4/2006 | Sampsell |
| 2006/0220160 A1 | 10/2006 | Miles |
| 2006/0262380 A1 | 11/2006 | Miles |
| 2006/0268388 A1 | 11/2006 | Miles |
| 2006/0274074 A1 | 12/2006 | Miles |
| 2006/0274398 A1 | 12/2006 | Chou |
| 2007/0040777 A1 | 2/2007 | Cummings |
| 2007/0086078 A1 | 4/2007 | Hagood et al. |
| 2007/0092728 A1* | 4/2007 | Ouderkirk et al. ......... 428/411.1 |
| 2007/0097694 A1 | 5/2007 | Faase |
| 2007/0115415 A1 | 5/2007 | Piehl |
| 2007/0121118 A1 | 5/2007 | Gally et al. |
| 2007/0177247 A1 | 8/2007 | Miles |
| 2007/0194630 A1 | 8/2007 | Mignard et al. |
| 2007/0195392 A1* | 8/2007 | Phillips et al. ................. 359/15 |
| 2007/0216987 A1 | 9/2007 | Hagood et al. |
| 2007/0279729 A1 | 12/2007 | Kothari et al. |
| 2007/0281241 A1* | 12/2007 | Wolk et al. .................... 430/200 |
| 2008/0003710 A1 | 1/2008 | Kogut et al. |
| 2008/0013144 A1 | 1/2008 | Chui et al. |
| 2008/0013145 A1 | 1/2008 | Chui et al. |
| 2008/0013154 A1 | 1/2008 | Chui |
| 2008/0037093 A1 | 2/2008 | Miles |
| 2008/0055705 A1 | 3/2008 | Kothari |
| 2008/0055706 A1 | 3/2008 | Chui et al. |
| 2008/0055707 A1 | 3/2008 | Kogut et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0094690 A1 | 4/2008 | Luo et al. |
| 2008/0106782 A1 | 5/2008 | Miles |
| 2008/0110855 A1 | 5/2008 | Cummings |
| 2008/0112035 A1 | 5/2008 | Cummings |
| 2008/0112036 A1 | 5/2008 | Cummings |
| 2008/0186581 A1 | 8/2008 | Bita et al. |
| 2008/0239455 A1 | 10/2008 | Kogut et al. |
| 2008/0247028 A1 | 10/2008 | Chui et al. |
| 2009/0219604 A1 | 9/2009 | Miles |
| 2010/0165443 A1 | 7/2010 | Chui |
| 2010/0214642 A1 | 8/2010 | Miles |
| 2010/0245975 A1 | 9/2010 | Cummings |

FOREIGN PATENT DOCUMENTS

| | | |
|---|---|---|
| EP | 0 667 548 | 8/1995 |
| EP | 0 786 911 | 7/1997 |
| EP | 1 275 997 | 1/2003 |
| EP | 1 473 581 | 11/2004 |
| EP | 1 748 305 | 1/2007 |
| EP | 2 030 947 | 3/2009 |
| EP | 1 800 172 B1 | 2/2011 |
| JP | 02-068513 | 3/1990 |
| JP | 03-199920 | 8/1991 |
| JP | 08 018990 | 1/1996 |
| JP | 10 500224 | 1/1998 |
| JP | 11-211999 | 8/1999 |
| JP | 11211999 | 8/1999 |
| JP | 2000 500245 | 1/2000 |
| JP | 2002-062490 | 2/2000 |
| JP | 2001-221913 | 8/2001 |
| JP | 2002-221678 | 8/2002 |
| JP | 2004-212638 | 7/2004 |
| JP | 2004-212680 | 7/2004 |
| JP | 2004-212922 | 7/2004 |
| JP | 2005 279831 | 10/2005 |
| WO | WO 95/30924 | 11/1995 |
| WO | WO 97/17628 | 5/1997 |
| WO | WO 03/007049 | 1/2003 |
| WO | WO 2004/015489 | 2/2004 |
| WO | WO 2005/111669 | 11/2005 |
| WO | WO 2006/036540 | 4/2006 |
| WO | WO 2008/045222 | 4/2008 |
| WO | WO 2009/032525 | 3/2009 |

OTHER PUBLICATIONS

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Miles, Mark, W., "A New Reflective FPD Technology Using Interferometric Modulation", The Proceedings of the Society for Information Display (May 11-16, 1997).

Taii et al., "A transparent sheet display by plastic MEMS," Journal of the SID 14(8):735-741, 2006.

European Search Report for EP 08153441, Dated Mar. 17, 2009.

International Search Report and Written Opinion for PCT/US2008/073610, Dated Apr. 6, 2009.

Miles, M. W., "A Mems Based Inteferometric Modulator (IMOD) For Display Applications," Proceedings of Sensors Expo, 1997, pp. 281-284, Helmers Publishing Inc.

Partial European Search Report for EP 08153441, Dated Nov. 19, 2008.

International Preliminary Report on Patentability for International Application No. PCT/US2008/073610 mailed Nov. 30, 2009.

Feenstra et al., Electrowetting displays, Liquivista BV, 16 pp., Jan. 2006.

Lezec, Submicrometer dimple array based interference color field displays and sensors, Nano Lett. 7(2):329-333, Dec. 23, 2006.

Aratani K. et al. "Surface Micromachined Tuneable Interferometer Array," Sensors and Actuators A, vol. A43, No. 1/3, pp. 17-23, May 1994.

Miles, M. et al., "Digital Paper ™ for reflective displays," Journal of the Society for Information Display, Society for Information Display, San Jose, US, vol. 11, No. 1, pp. 209-215, 2003.

"Optical constants of AlAs (Aluminium arsenide)," available at http://refractiveindex.info/?group=Crystals&material=AlAs at least as of Jul. 6, 2011.

"Optical constants of InP (Indium phosphide)," available at http://refractiveindex.info/?group=Crystals&material=InP at least as of Jul. 6, 2011.

"Optical constants of poly-Si (Polysilicon)," available at http://refractiveindex.info/?group=Crystals&rnaterial=poly-Si at least as of Jul. 6, 2011.

"Refractive index n of $In_xGa_{1-x}As$ alloys," available at http://www.batop.de/information/n_InGaAs.html at least as of Jul. 6, 2011.

"Refractive Index of GaAs, Gallium Arsenide," available at http://www.filmetrics.corn/refractive-index-database/GaAs/Gallium-Arsenide at least as of Jul. 6, 2011.

Gally, "Wide-Gamut Color Reflective Displays Using iMoD Interference Technology," SID 04 Digest, pp. 654-657, 2004.

International Search Report and Written Opinion in PCT/US2005/032633 (International Publication No. WO 2006/036540) dated Feb. 03, 2006.

International Preliminary Report and Written Opinion in PCT/US2005/032633 (International Publication No. WO 2006/036540) dated Apr. 5, 2007.

Office Action in U.S. Appl. No. 11/213,659 dated Oct. 29, 2008.

Amendment and Response in U.S. Appl. No. 11/213,659 dated Mar. 30, 2009.

Notice of Allowance in U.S. Appl. No. 11/213,659 dated Jul. 20, 2009.

Request for Continued Examination and Information Disclosure Statement in U.S. Appl. No. 11/213,659, dated Oct. 19, 2009.

Notice of Allowance and Fees Due in U.S. Appl. No. 11/213,659, dated Nov. 18, 2009.

Request for Continued Examination and Information Disclosure Statement in U.S. Appl. No. 11/213,659, dated Feb. 17, 2010.

Amendment and Information DIsclosure Statement in U.S. Appl. No. 11/213,659, dated Feb. 25, 2010.

Notice of Allowance in U.S. Appl. No. 11/213,659, dated Apr. 8, 2010.

Request for Continued Examination, Information Disclosure Statement, and Petition to Withdraw from Issue in U.S. Appl. No. 11/213,659, dated Aug. 18, 2010.

Petition Grant in U.S. Appl. No. 11/213,659, dated Aug. 19, 2010.

Amendment in U.S. Appl. No. 11/213,659, dated Aug. 27, 2010.

Notice of Allowance in U.S. Appl. No. 11/213,659, dated Sep. 21, 2010.

Application as Filed in U.S. Appl. No. 12/831,517, dated Jul. 7, 2010.

Notice of Abandonment in U.S. Appl. No. 12/831,517, dated Mar. 28, 2011.

Application as Filed in U.S. Appl. No. 13/016,107, dated Jan. 28, 2011.

Preliminary Amendment in U.S. Appl. No. 13/016,107, dated Apr. 25, 2011.

Second Preliminary Amendment in U.S. Appl. No. 13/016,107, dated May 24, 2011.

Office Action in European Application No. Ep 05800920.0 dated May 21, 2008.

Summons to attend oral proceedings in European Application No. 05800920, dated Dec. 4, 2009.

Result of consultation in European Application No. 05800920, dated Feb. 23, 2010.

Minutes of the Oral Proceedings in European Application No. 05 800 920.1, dated May 20, 2010.

Notice of Intention to Grant in European Application No. 05800920, dated Jun. 2, 2010.

International Search Report and Written Opinion in PCT/US2007/020969 (International Publication No. WO 2008/045222) dated Mar. 5, 2008.

International Preliminary Report on Patentability in PCT/US2007/020969 (International Publication No. WO 2008/045222) dated Dec. 23, 2008.

Office Action in U.S. Appl. No. 11/544,978 dated Sep. 30, 2008.

Response to Office Action in U.S. Appl. No. 11/544,978 filed Jan. 30, 2009.

Final Office Action in U.S. Appl. No. 11/544,978 dated Apr. 30, 2009.

Request for Continued Examination in U.S. Appl. No. 11/544,978 filed Jul. 29, 2009.

Notice of Allowance in U.S. Appl. No. 11/544,978 dated Nov. 4, 2009.

Comments on Statement of Reasons for Allowance in U.S. Appl. No. 11/544,978 filed Feb. 4, 2010.

Petition to Withdraw from Issue and Request for Continued Examination in U.S. Appl. No. 11/544,978 filed Mar. 19, 2010.

Petition Decision in U.S. Appl. No. 11/544,978 dated Mar. 22, 2010.

Notice of Allowance in U.S. Appl. No. 11/544,978 dated Apr. 23, 2010.

Request for Continued Examination in U.S. Appl. No. 11/544,978 filed Jul. 22, 2010.

Supplement to the Request for Continued Examination in U.S. Appl. No. 11/544,978 filed Jul. 26, 2010.

Notice of Allowance in U.S. Appl. No. 11/544,978 dated Aug. 6, 2010.

Office Action in Chinese Patent Application No. 200880107832.6, dated Jul. 27, 2011.

* cited by examiner

INTERFEROMETRIC OPTICAL MODULATOR WITH BROADBAND REFLECTION CHARACTERISTICS

BACKGROUND

1. Field of the Invention

The field of the invention relates to microelectromechanical systems (MEMS), and more particularly to displays comprising MEMS.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

A number of exemplary embodiments of the invention are disclosed. In one embodiment an optical device is disclosed, the optical device comprising: an optical stack comprising: a first layer having a first refractive index; a second layer over the first layer, the second layer having a second refractive index less than the first refractive index; and a third layer over the second layer, the third layer having a third refractive index larger than the second refractive index; and a fourth layer that is at least partially optically absorptive, wherein the optical stack and the fourth layer are a first distance from one another when the device is in a first state and are a second distance from one another when the device is in a second state, the first distance different from the second distance.

In one embodiment a method of forming an optical device is disclosed, the method comprising: forming a first layer, the first layer having a first refractive index; forming a second layer over the first layer, the second layer having a second refractive index less than the first refractive index; forming a third layer over the second layer, the third layer having a third refractive index larger than the second refractive index; forming a sacrificial layer over the third layer; forming a fourth layer that is at least partially optically absorptive over the sacrificial layer; and removing the sacrificial layer.

In one embodiment a method of modulating light is disclosed, the method comprising: providing an optical device comprising: an optical stack comprising: a first layer having a first refractive index; a second layer over the first layer, the second layer having a second refractive index less than the first refractive index; and a third layer over the second layer, the third layer having a third refractive index larger than the second refractive index; and a fourth layer that is at least partially optically absorptive, wherein the optical stack and the fourth layer are a first distance from one another when the device is in a first state and are a second distance from one another when the device is in a second state, the first distance different from the second distance; applying a first voltage to the device to place the device in the first state; and applying a second voltage to the device to place the device in the second state.

In one embodiment an optical device is disclosed, the optical device comprising: first means for reflecting and transmitting light, the first means having a first refractive index; second means for reflecting and transmitting light, the second means over the first means, the second means having a second refractive index less than the first refractive index; and third means for reflecting and transmitting light, the third means over the second means, the third means having a third refractive index larger than the second refractive index; and fourth means for reflecting and absorbing light, wherein the third means and the fourth means are a first distance from one another when the device is in a first state and are a second distance from one another when the device is in a second state, the first distance different from the second distance.

DETAILED DESCRIPTION OF PREFERRED EMBODIMENTS

The following detailed description is directed to certain specific embodiments of the invention. However, the invention can be embodied in a multitude of different ways. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
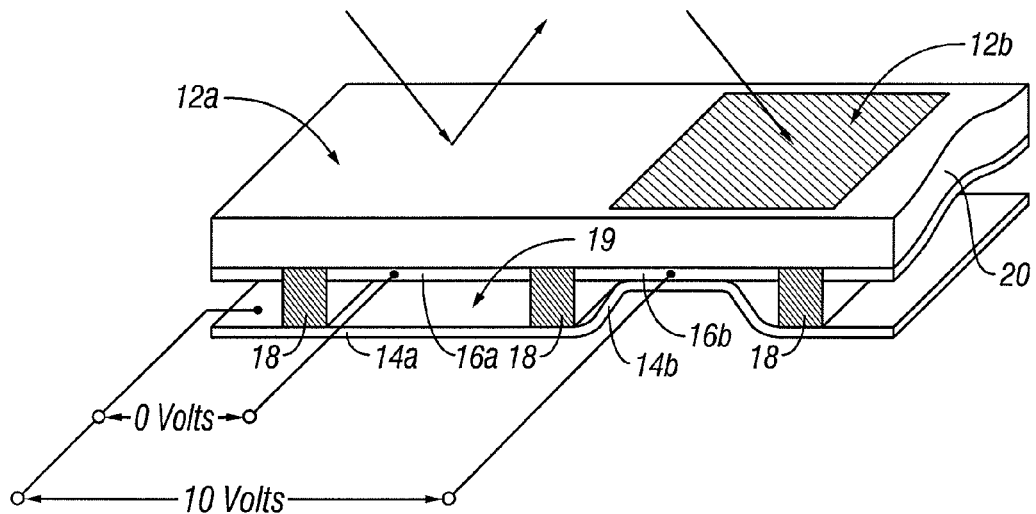
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
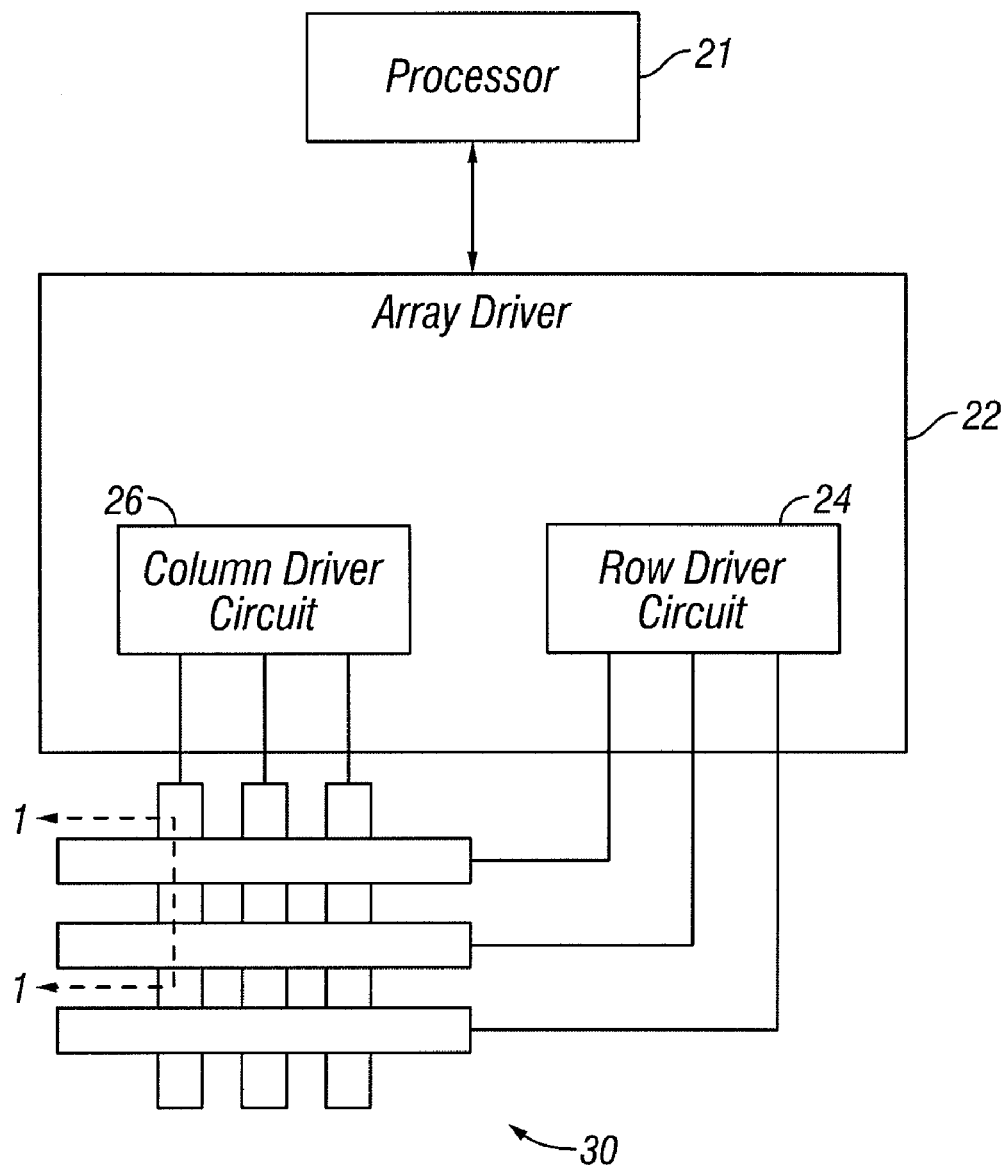
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
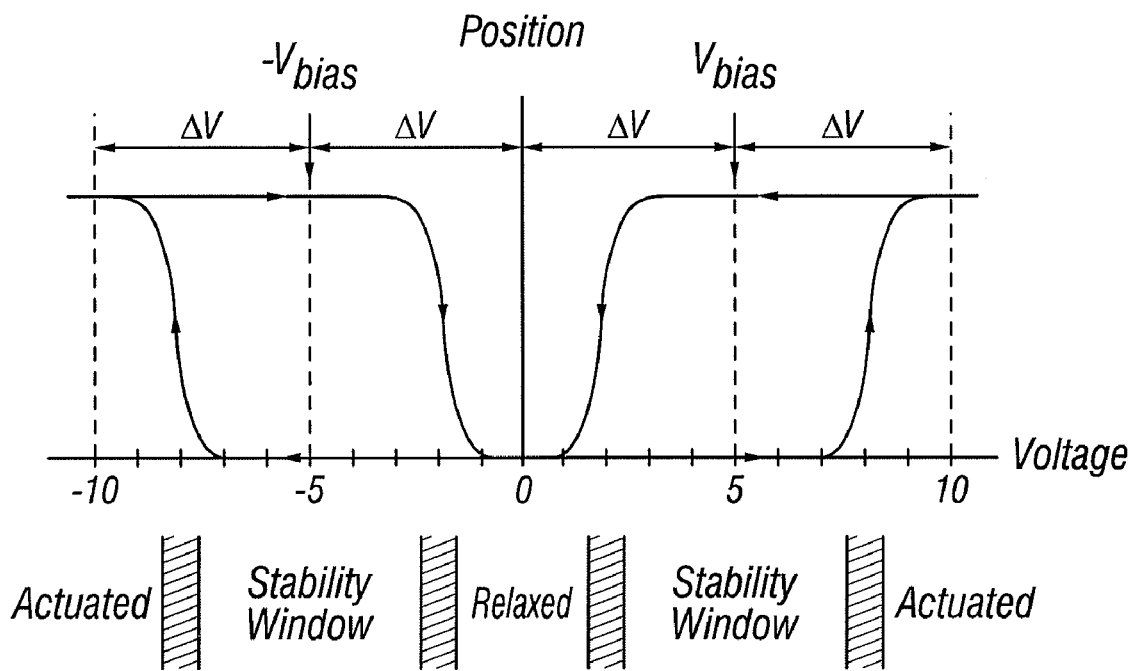
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
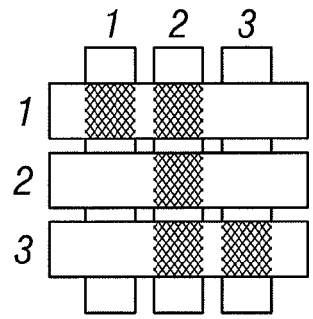
FIG. 5A illustrates one exemplary frame of display data in the 3×3 interferometric modulator display of FIG. 2.
Figure 5B:
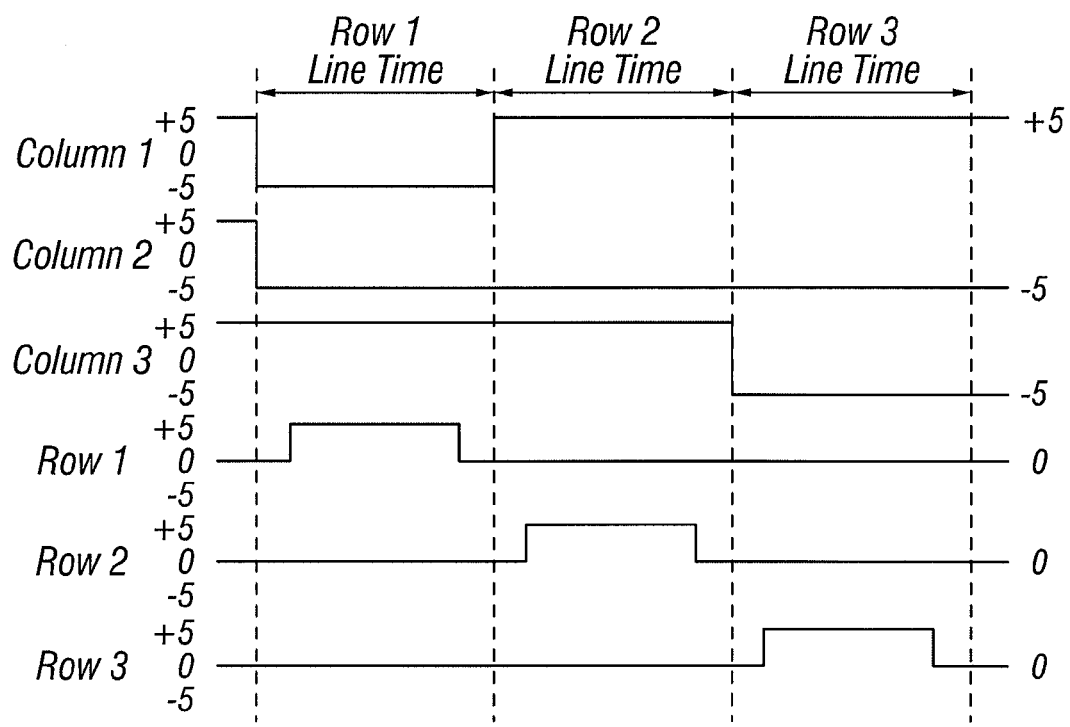
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
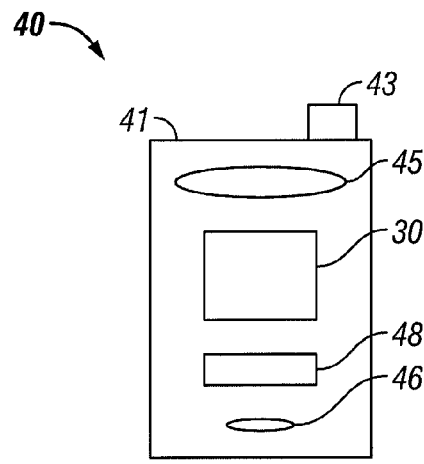
FIGS. 6A and 6B are system block diagrams illustrating an embodiment of a visual display device comprising a plurality of interferometric modulators.
Figure 6B:
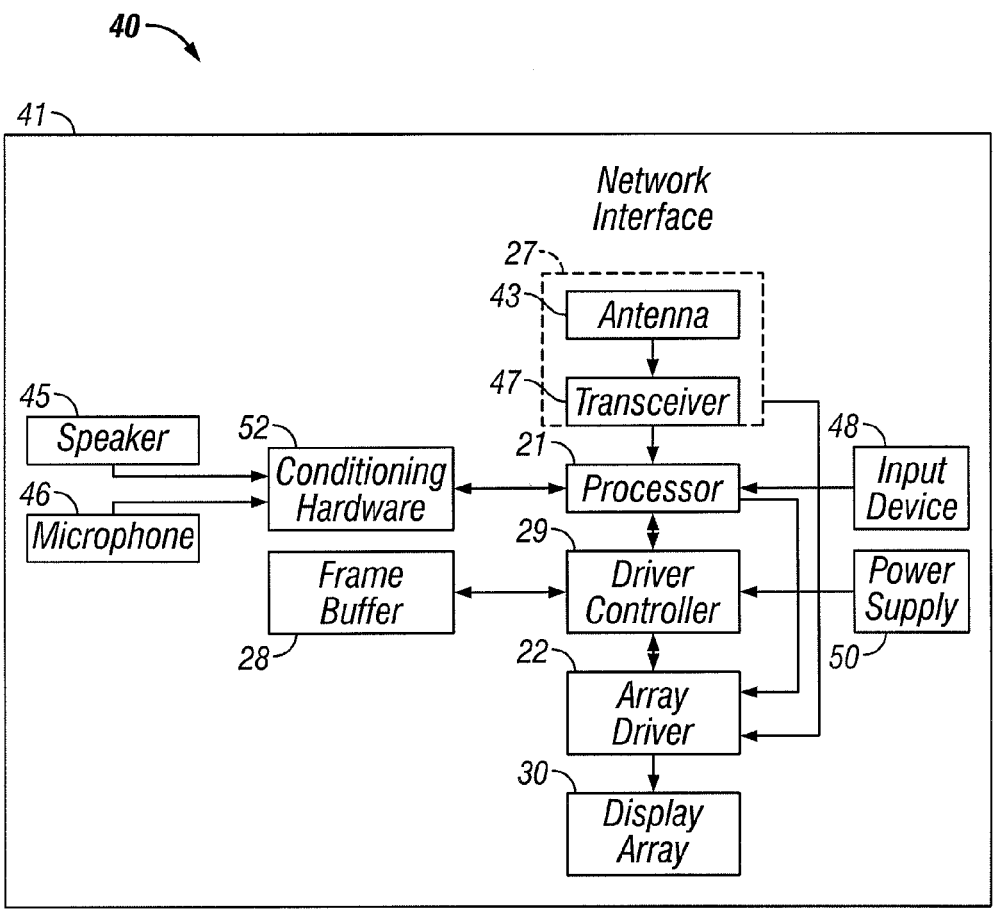

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions, portable media players, and computers.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The processor 21 may also be configured to execute one or more software applications, including a web browser, a telephone application, an email program, or any other software application. The processor 21 may also be configured to execute one or more software applications, including a web browser, a telephone application, an email program, or any other software application. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
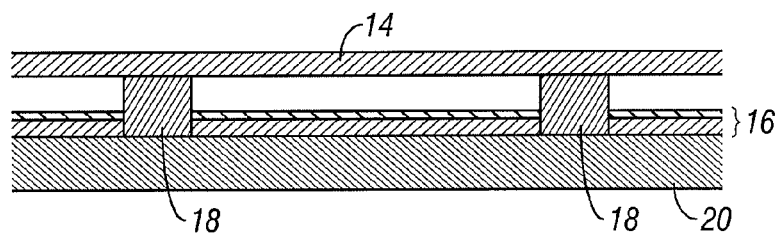
FIG. 7A is a cross section of the device of FIG. 1.
Figure 7B:
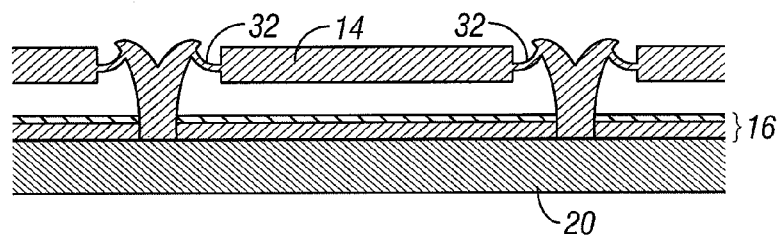
FIG. 7B is a cross section of an alternative embodiment of an interferometric modulator.
Figure 7C:
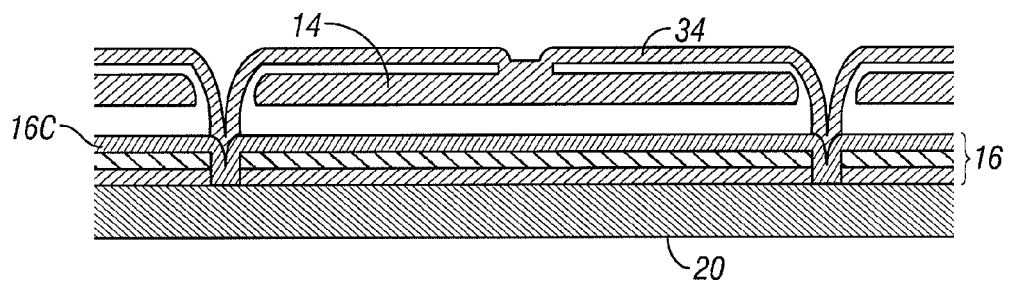
FIG. 7C is a cross section of another alternative embodiment of an interferometric modulator.
Figure 7D:
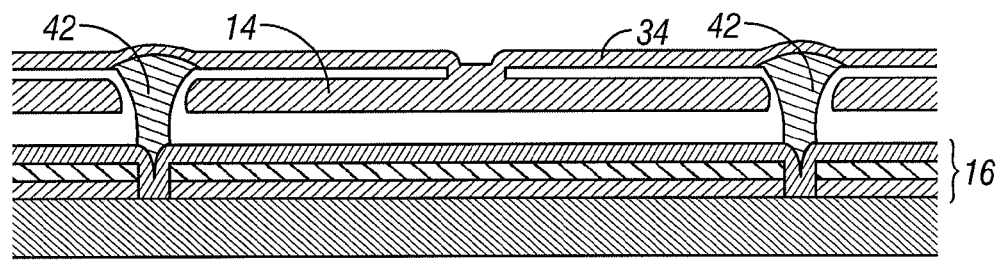
FIG. 7D is a cross section of yet another alternative embodiment of an interferometric modulator.
Figure 7E:
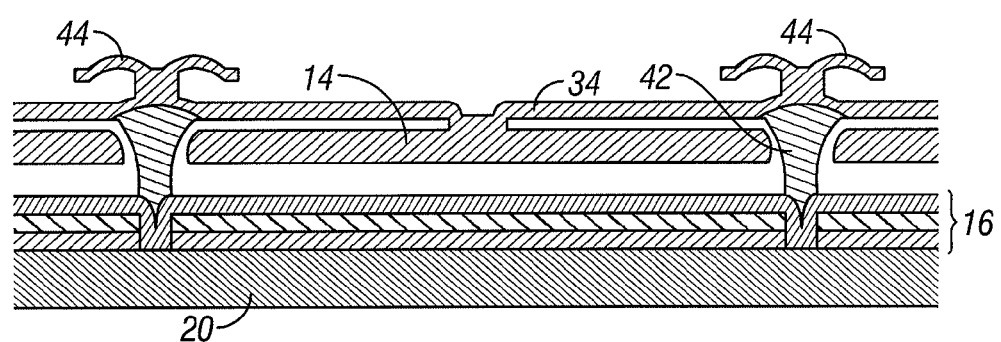
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

As disclosed herein, optical devices such as those illustrated in FIG. 7 can be used to create pixels in displays for electronic devices. These optical devices can be designed to appear any desired color while in the "bright" state. For example, the optical devices can be designed to preferentially reflect red, green, blue, or any other color of light while in the "bright" state. The optical devices can also be made to appear substantially white while in the "bright" state. One way of achieving a white "bright" state is to form a pixel out of a plurality of sub-pixels having different colors (e.g., yellow and cyan) such that the colors from the sub-pixels are spatially averaged by the eye of the observer to create the appearance of a white pixel. However, since each sub-pixel reflects only a relatively narrow range of visible light associated with a particular color (e.g., yellow or cyan), the overall reflectance of the pixel may be lower than would be the case if the pixel appeared white due to true broadband reflection.

As noted above, a display pixel with a substantially white "bright" state can also be achieved by configuring it to have relatively broadband reflection characteristics. This can be done, for example, by configuring optical devices such as those illustrated in FIG. 7 with a relatively thin gap between the reflective layer 14 and the optical stack 16. In some cases, however, the gap between the reflective layer 14 and the optical stack 16 that results in the desired broadband reflection characteristics may be required to be so narrow as to deemphasize the reflection of light from the device that is attributable to interference effects. Moreover, complications can arise in the fabrication of optical devices with the relatively small gap that gives rise to broadband reflection by the device. For example, undesired particles left in the space between the reflective layer 14 and the optical stack 16 due to manufacturing can make small gaps difficult to achieve. Nonplanarity in one or more of the reflective layer 14 and the optical stack 16 can also make small gaps difficult to achieve. Generally, the smaller the gap between the reflective layer 14 and the optical stack 16, the more critical manufacturing tolerances become.

Figure 8:
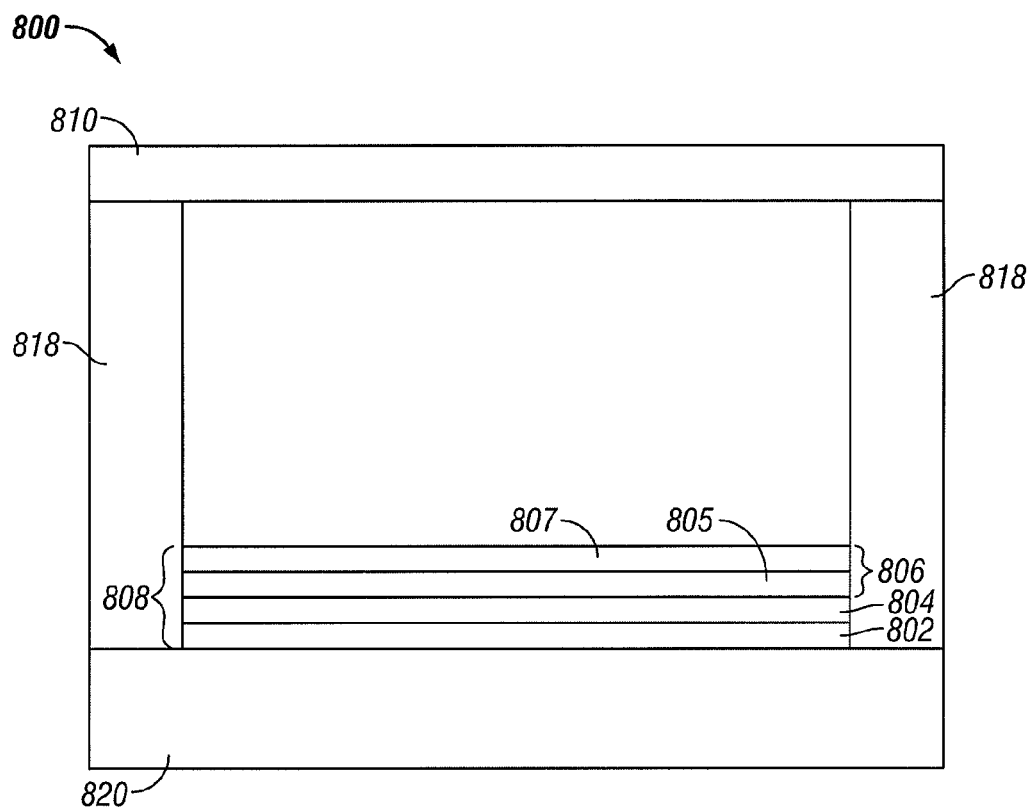
FIG. 8 is a cross section of an interferometric modulator with broadband reflective characteristics.

FIG. 8 illustrates yet another embodiment of an optical device 800 having a substantially white "bright" state. The white "bright" state of the optical device 800 follows as a result of the device's relatively broadband reflection characteristics, as described herein. Owing to its broadband reflection characteristics the optical device 800 can, in some circumstances, be used to form a display pixel with greater brightness than a white pixel that implements the technique of spatially averaging one or more sub-pixels of different colors. Moreover, the optical device 800 can be configured with a wider gap than might be required in other optical devices designed to reflect a broadband range of visible light. Thus, the optical device 800 can offer benefits with respect to certain aspects of the fabrication process when compared to a white pixel formed from an optical device that requires a relatively thinner interference gap to achieve a white appearance.

In some embodiments, the optical device 800 comprises an optical stack 808 having a first layer 802 with a first refractive index, a second layer 804 over the first layer 802 with a second refractive index less than the first refractive index, and a third layer 806 over the second layer 804 with a third refractive index larger than the second refractive index. The optical device 800 also comprises a fourth layer 810 that is at least partially optically absorptive. The optical stack 808 and the fourth layer 810 are a first distance from one another when the device 800 is in a first state (e.g., an unactuated state) and are a second distance from one another when the device is in a second state (e.g., an actuated state), the first distance being different from the second distance.

The optical stack 808 of the optical device 800 is formed on an optically transmissive substrate 820. The substrate 820 may, for example, comprise glass or plastic. The optical stack 808, schematically illustrated in FIG. 8, includes three substantially optically transmissive layers 802, 804, 806. In some embodiments, the three layers 802, 804, 806 of the optical stack 808 are formed from materials having a relatively high refractive index, a relatively low refractive index, and a relatively high refractive index, respectively. Thus, in some embodiments, the optical stack 808 has a high-low-high refractive index profile, though other refractive index profiles can also be used. For example, in some embodiments the optical stack 808 may comprise a single high refractive index layer. The width and refractive indexes of the layers in embodiments of the optical stack 808 can be varied to cause the optical device 800 to exhibit different optical characteristics, as disclosed herein. The optical stack 808 should not be confused with the optical stack 16 illustrated, for example, in FIGS. 7A-7E, which is distinct in structure and composition.

The optical stack 808 can be formed from dielectric materials, optically transmissive conductive materials (e.g., a material with a complex refractive index such as indium tin oxide), or combinations of the same and the like. In some embodiments, the first high-refractive index layer 802 and the second high-refractive index layer 806 each has a refractive index greater than about 1.7, while in some embodiments each of these high-refractive index layers has a refractive index greater than about 2. In some embodiments, the low-refractive index layer 804 has a refractive index less than about 1.5.

As illustrated in FIG. 8, the second high-refractive index layer 806 can include a plurality of sub-layers 805, 807. Each of the sub-layers 805, 807 of the second high-refractive index layer 806 may be formed from materials having a refractive index greater than about 1.7. However, the sub-layers 805, 807 need not have identical refractive indexes.

The sub-layers 805, 807 can be used, for example, to enhance the optical or electrical performance of the optical device 800. In some embodiments, one sub-layer (e.g., sub-layer 805) comprises an electrically conductive material such as indium tin oxide (ITO). Such a sub-layer can serve as an electrode used for electrical actuation of the optical device, as described herein. While one sub-layer may be selected based on its electrical performance, another sub-layer (e.g., sub-layer 807) may be selected based on its optical performance. For example, a sub-layer may be formed from a dielectric material selected based on its refractive index in order to enhance the optical performance of the device 800. Just as the second high-refractive index layer 806 can include a plurality of sub-layers, in a like manner the first high-refractive index layer 802 and the low-refractive index layer 804 can also include a plurality of sub-layers (not illustrated).

In some embodiments, the first high-refractive index layer 802 comprises ITO, silicon nitride ($Si_3N_4$), titanium oxide ($TiO_2$), zirconium oxide ($ZrO_2$), yttrium oxide ($Y_2O_3$), antimony oxide ($Sb_2O_3$), zinc selenide (ZnSe), combinations of the same, or other similar high-refractive index materials. The second high-refractive index layer 806 can be formed from the same materials as the first high-refractive index layer 802. In some embodiments, the first high-refractive index layer 802 has a thickness in a range between about 700 Å and about 1350 Å, while the second high-refractive index layer 806 has a thickness in a range between about 100 Å and about 550 Å.

In some embodiments, the low-refractive index layer 804 comprises cryolite ($Na_3AlF_6$), magnesium fluoride ($MgF_2$), fluorinated silicon oxide ($SiO_x$), combinations of the same or the like. In some embodiments, the low-refractive index layer 804 has a thickness in a range between about 900 Å and about 1600 Å.

The optical device 800 also includes an at least partially optically absorptive layer 810. For example, in some embodiments the material used to form the optically absorptive layer 810 has an extinction coefficient in a range between about 0.05 and 1.00 for visible wavelengths of light. Materials having extinction coefficients outside of this range can also be used, however. In some embodiments, the optically absorptive layer 810 is generally parallel to the optical stack 808 and is supported by sidewalls 818. The structure for supporting the absorptive layer 810 can be configured similarly to the support structures for the reflective layer 14 illustrated in FIGS. 7A-7E.

The optically absorptive layer 810 is separated from the optical stack 808 by a first distance when the optical device 800 is in a first state (e.g., an unactuated state). In some embodiments, the first distance is in a range between about 1300 Å and about 2300 Å. In other embodiments, the first distance is in a range between about 3200 Å and about 4400 Å. The first state corresponds to the "bright" state of the optical device 800. In the "bright" state, the optical device 800 reflects a broadband range of visible light that is incident upon the device 800 at the substrate 820. Thus, in some embodiments, the optical device 800 appears substantially white in the "bright" state, as described herein. The reflection of light by the optical device 800 is caused by interference effects as light is partially reflected or transmitted at the interfaces between the various layers (e.g., 802, 804, 806, and 810) of the optical device 800.

The space between the optically absorptive layer 810 and the optical stack 808 when the device 800 is in the first state can be filled with a gas (e.g., air). In other embodiments, the space between the optically absorptive layer 810 and the optical stack 808 is an at least partial vacuum. In some embodiments, the refractive index of the gas that occupies the space between the absorptive layer 810 and the optical stack 808 is approximately one. Therefore, the refractive index profile of the optical stack 808 taken in combination with the gap between the optical stack 808 and the absorptive layer 810 is high-low-high-low.

The optically absorptive layer 810 is separated from the optical stack 808 by a second distance when the optical device 800 is in a second state (e.g., an actuated state). For example, in some embodiments, the second distance is approximately zero Å. When the optical device 800 is in the second state, the optically absorptive layer 810 and the optical stack 808 may contact one another or they may merely come within close proximity of one another.

In some embodiments, the absorptive layer 810 comprises molybdenum, nickel, silicon, $TiN_xW_y$, titanium nitride (TiN), germanium (either crystalline or amorphous), carbon, iron, chromium, tungsten, tin nitride ($SnN_x$), $Si_xGe_{1-x}$ alloy, or combinations of the same. In some embodiments, the absorptive layer 810 has a thickness in a range between about 30 Å and about 3000 Å. In other embodiments, the absorptive layer 810 has a thickness greater than 3000 Å. In some embodiments, the absorptive layer 810 comprises an absorptive sub-layer and a mechanical support sub-layer (not shown). In some embodiments, the mechanical support sub-layer can be formed on the side of the absorptive sub-layer opposite the optical stack 808. The mechanical support sub-layer adds stability to the absorptive layer 810 and can also serve as an electrode for electrical actuation of the device 800. The mechanical support sub-layer can be formed from nickel, for example.

FIG. 8 illustrates the optical device in the first state (e.g., the unactuated state). In the second state (e.g., the actuated state), the optical device 800 would appear similar to the optical device 12b in FIG. 1, according to one embodiment. The second state is the "dark" state. In this state, the optical device 800 couples an increased amount of light energy into the absorptive layer 810 as compared to the unactuated state. The reflectance of the optical device 800 is decreased because an increased amount of light energy is absorbed in the absorptive layer 810 rather than being reflected by the optical stack 808.

As described herein, when an electrical voltage is applied to electrodes of the optical device 800, the absorptive layer is actuated toward the optical stack 808 (or vice versa) in a direction generally normal to the surface of the optical stack 808. The electrical voltage is applied across two electrodes. In one embodiment of the optical device 800, a sub-layer of ITO within the optical stack 808 serves as one electrode, while the absorptive layer 810 (e.g., a mechanical support sub-layer of the absorptive layer 810) serves as another electrode.

Figure 9:
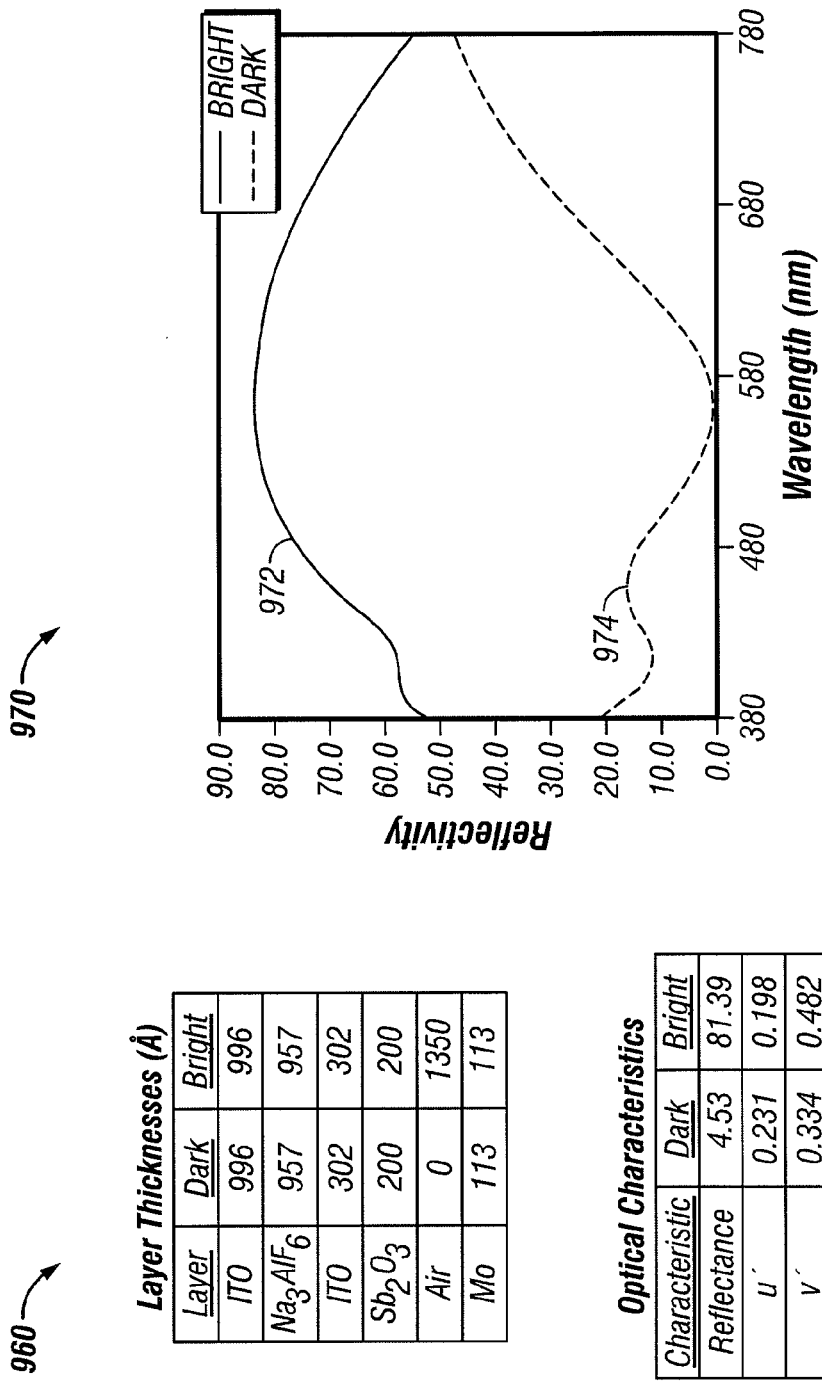
FIG. 9 includes a table and plot summarizing the structural and optical characteristics of an embodiment of the interferometric modulator of FIG. 8.

FIG. 9 illustrates the structure and optical characteristics of an embodiment of the optical device 800. As illustrated in table 960, in the embodiment illustrated in FIG. 9, the first high-refractive index layer 802 has a thickness of approximately 996 Å and comprises ITO. The low-refractive index layer 804 has a thickness of approximately 957 Å and comprises cryolite. The second high-refractive index layer 806 includes sub-layers 805 and 807. Sub-layer 805 has a thickness of approximately 302 Å and comprises ITO. Sub-layer 807 has a thickness of approximately 200 Å and comprises antimony oxide. The optical stack 808 is separated from the absorptive layer 810 by an air gap. In the "bright" state, the air gap has a thickness of approximately 1350 Å, and a thickness of approximately 0 Å for the "dark" state. The absorptive layer 810 has a thickness of approximately 113 Å and comprises molybdenum. In some embodiments, the molybdenum is backed by a layer of nickel having a thickness of approximately 1000 Å or higher.

Table 960 also summarizes the optical characteristics of the embodiment of the optical device 800 illustrated in FIG. 9. The values for the optical characteristics in table 960 can be calculated using simulation techniques or via experimentation, as is known in the art. In the embodiment illustrated in FIG. 9, as well as those illustrated in FIGS. 10-19, the optical characteristics have been determined for the case where light is incident upon the optical stack 808 through a glass substrate 820 with a refractive index of about 1.52. Moreover, in each case the optical characteristics presented in FIGS. 9-19 assume that the absorptive layer 810 includes a mechanical support sub-layer of nickel with a thickness of at least about 1000 Å. It should be understood, however, that some embodiments include a substrate layer 820 made from a different material and/or having a different refractive index. In addition, some embodiments include an absorptive layer with a mechanical support sub-layer having a different thickness or made from a different material, while still others do not include a mechanical support sub-layer. Nevertheless, the values for the optical characteristics for the embodiments illustrated in FIGS. 9-19 are generally representative of embodiments with other types of mechanical support sub-layers, or even embodiments without a mechanical support sub-layer, since the effect of the mechanical support sub-layer on the optical characteristics of the optical device 800 is generally relatively minor.

The optical device 800, illustrated in FIG. 9, has an average reflectance of 81.39% in the "bright" state and 4.53% in the "dark" state. In this case, the average reflectance was calculated after weighting the reflectance of the optical device 800 across the visible spectrum according to the human visual response at each wavelength. For example, the reflectance values in the range from 480-630 nm are weighted more heavily in arriving at the average reflectance value since the human eye is more sensitive to light in this band. The plot 970 graphically illustrates the reflectance of the optical device 800 as a function of wavelength. Curve 972 illustrates the reflectance of the optical device 800 while in the "bright" state, while curve 974 illustrates the reflectance of the device 800 while in the "dark" state.

The contrast ratio in table 960 is computed as the ratio of the eye response-weighted average reflectance of the optical device in the "bright" state to the eye response-weighted average reflectance in the "dark" state. For the embodiment illustrated in FIG. 9, the contrast ratio of the optical device is 17.96. In some embodiments, the relative and absolute thicknesses of the layers 802, 804, 806, 810 of the optical device 800 can be selected to maximize, or approximately maximize, the contrast ratio of an optical device formed of a selected set of materials.

Table 960 also includes u' and v' coordinates for both the "dark" and "bright" states. These are chromaticity coordinates of the apparent color of the light reflected by the optical device in each of these states. The coordinates correspond to a specific color in the gamut defined in the International Commission on Illumination (CIE) standard color spaces. In some embodiments, the optical device 800 is designed so that the (u', v') coordinate pair in the "bright" state corresponds to a standard white point such as D65, though other white points (e.g., E, D50, D55, D75, etc.) can be targeted depending upon the anticipated viewing conditions of, for example, a display made up of a plurality of optical devices 800. For example, for D65 (u',v') is approximately (0.19, 0.47).

Figure 10:
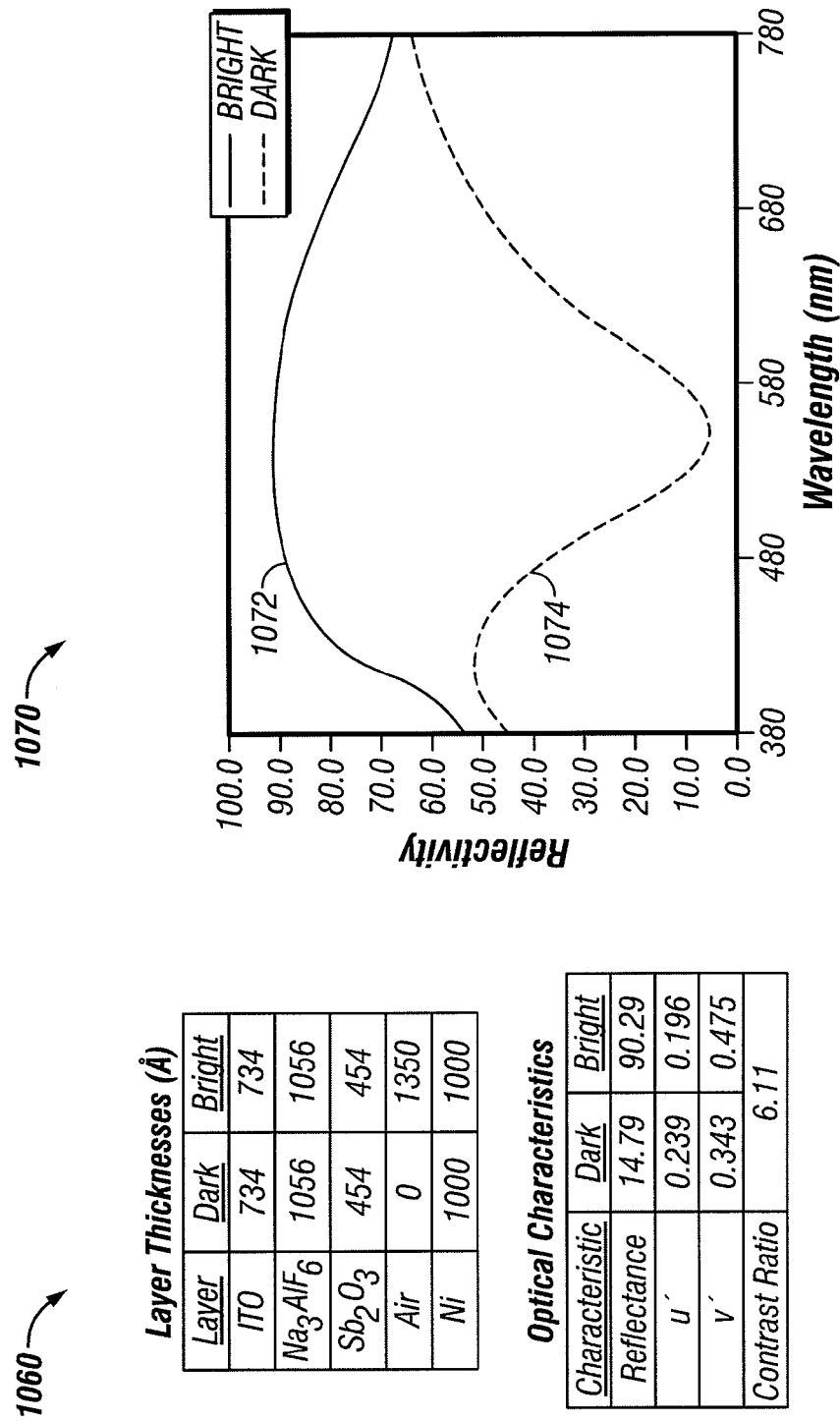
FIG. 10 includes a table and plot summarizing the structural and optical characteristics of an embodiment of the interferometric modulator of FIG. 8.

FIG. 10 illustrates the structure and optical characteristics of another embodiment of the optical device 800. As illustrated in table 1060, in the embodiment illustrated in FIG. 10, the first high-refractive index layer 802 has a thickness of approximately 734 Å and comprises ITO. The low-refractive index layer 804 has a thickness of approximately 1056 Å and comprises cryolite. The second high-refractive index layer has a thickness of approximately 454 Å and comprises antimony oxide. The optical stack 808 is separated from the absorptive layer 810 by an air gap. In the "bright" state, the air gap has a thickness of approximately 1350 Å. The absorptive layer 810 has a thickness of approximately 1000 Å and comprises nickel.

The optical device 800 that is illustrated in FIG. 10 has an average reflectance of approximately 90.29% in the "bright" state and approximately 14.79% in the "dark" state. The plot 1070 graphically illustrates the reflectance of the optical device 800 as a function of wavelength. Curve 1072 illustrates the reflectance of the optical device 800 while in the "bright" state, while curve 1074 illustrates the reflectance of the device 800 while in the "dark" state. For the embodiment illustrated in FIG. 10, the contrast ratio of the optical device 800 is approximately 6.11. Table 1060 also includes u' and v' coordinates for both the "dark" and "bright" states. The u' coordinate in the "bright" state is approximately 0.196. The v' coordinate in the "bright" state is approximately 0.475.

Figure 11:
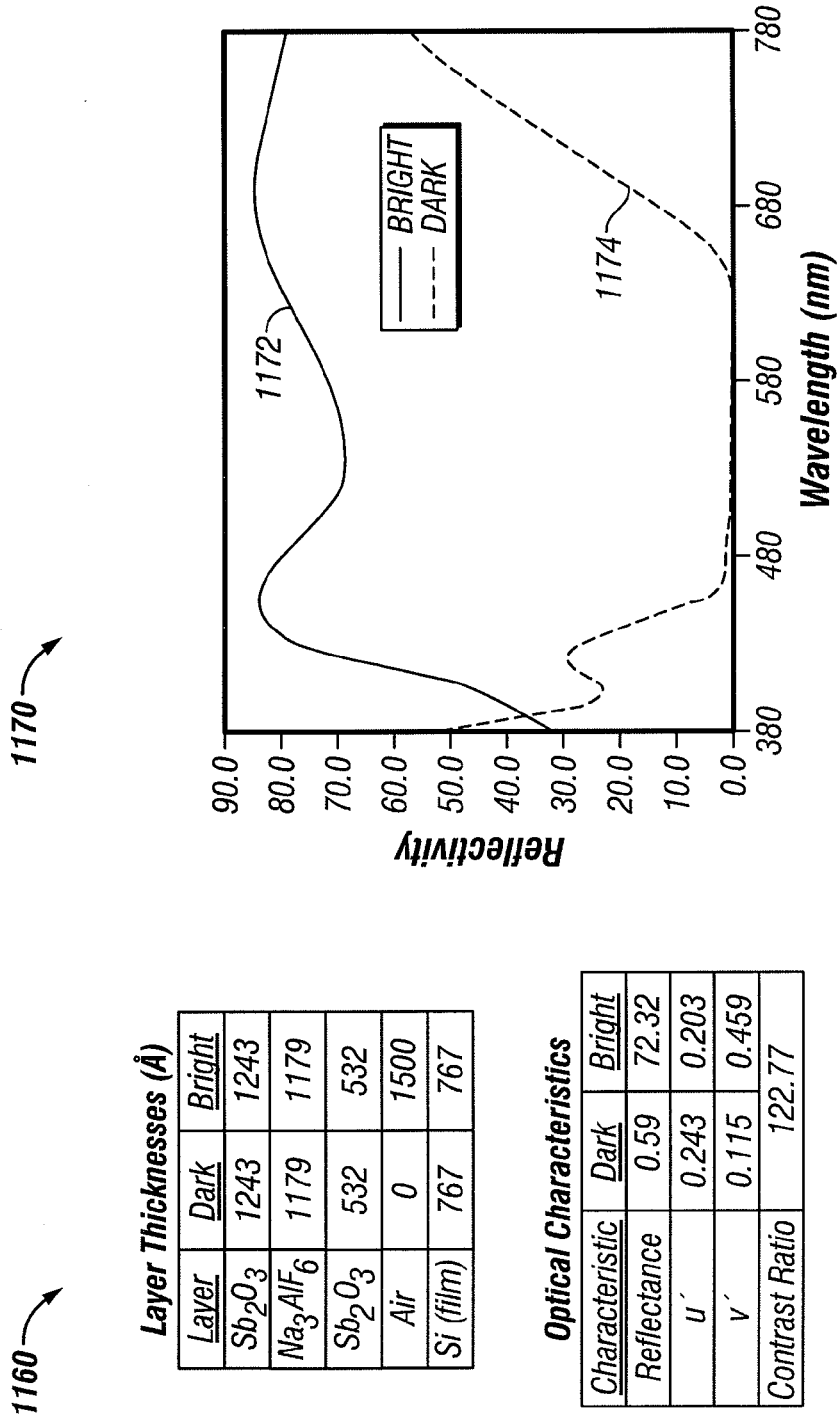
FIG. 11 includes a table and plot summarizing the structural and optical characteristics of an embodiment of the interferometric modulator of FIG. 8.

FIG. 11 illustrates the structure and optical characteristics of another embodiment of the optical device 800. As illustrated in table 1160, in the embodiment illustrated in FIG. 11, the first high-refractive index layer 802 has a thickness of approximately 1243 Å and comprises antimony oxide. The low-refractive index layer 804 has a thickness of approximately 1179 Å and comprises cryolite. The second high-refractive index layer has a thickness of approximately 532 Å and comprises antimony oxide. The optical stack 808 is separated from the absorptive layer 810 by an air gap. In the "bright" state, the air gap has a thickness of approximately 1500 Å. The absorptive layer 810 has a thickness of approximately 767 Å and comprises silicon. In some embodiments the silicon is backed by a layer of nickel having a thickness of approximately 1000 Å or higher.

The optical device 800 that is illustrated in FIG. 11 has an average reflectance of approximately 72.32% in the "bright" state and approximately 0.59% in the "dark" state. The plot 1170 graphically illustrates the reflectance of the optical device 800 as a function of wavelength. Curve 1172 illustrates the reflectance of the optical device 800 while in the "bright" state, while curve 1174 illustrates the reflectance of the device 800 while in the "dark" state. For the embodiment illustrated in FIG. 11, the contrast ratio of the optical device 800 is approximately 122.77. Table 1160 also includes u' and v' coordinates for both the "dark" and "bright" states. The u' coordinate in the "bright" state is approximately 0.203. The v' coordinate in the "bright" state is approximately 0.459.

Figure 12:
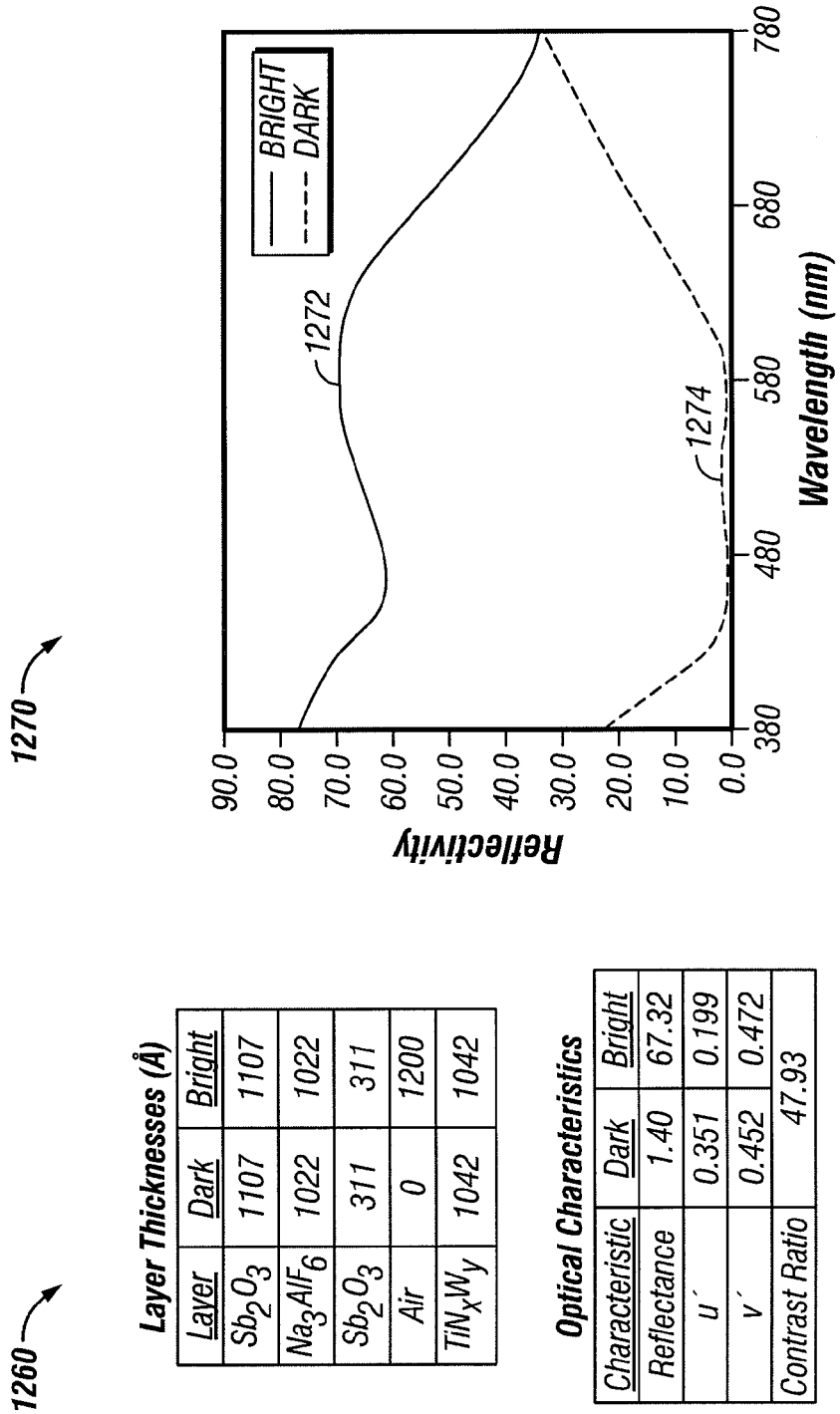
FIG. 12 includes a table and plot summarizing the structural and optical characteristics of an embodiment of the interferometric modulator of FIG. 8.

FIG. 12 illustrates the structure and optical characteristics of another embodiment of the optical device 800. As illustrated in table 1260, in the embodiment illustrated in FIG. 12, the first high-refractive index layer 802 has a thickness of approximately 1107 Å and comprises antimony oxide. The low-refractive index layer 804 has a thickness of approximately 1022 Å and comprises cryolite. The second high-refractive index layer has a thickness of approximately 311 Å and comprises antimony oxide. The optical stack 808 is separated from the absorptive layer 810 by an air gap. In the "bright" state, the air gap has a thickness of approximately 1200 Å. The absorptive layer 810 has a thickness of approximately 1042 Å and comprises $TiN_xW_y$. In some embodiments the $TiN_xW_y$ is backed by a layer of nickel having a thickness of approximately 1000 Å or higher.

The optical device 800 that is illustrated in FIG. 12 has an average reflectance of approximately 67.32% in the "bright" state and approximately 1.40% in the "dark" state. The plot 1270 graphically illustrates the reflectance of the optical device 800 as a function of wavelength. Curve 1272 illustrates the reflectance of the optical device 800 while in the "bright" state, while curve 1274 illustrates the reflectance of the device 800 while in the "dark" state. For the embodiment illustrated in FIG. 12, the contrast ratio of the optical device 800 is approximately 47.93. Table 1260 also includes u' and v' coordinates for both the "dark" and "bright" states. The u' coordinate in the "bright" state is approximately 0.199. The v' coordinate in the "bright" state is approximately 0.472.

Figure 13:
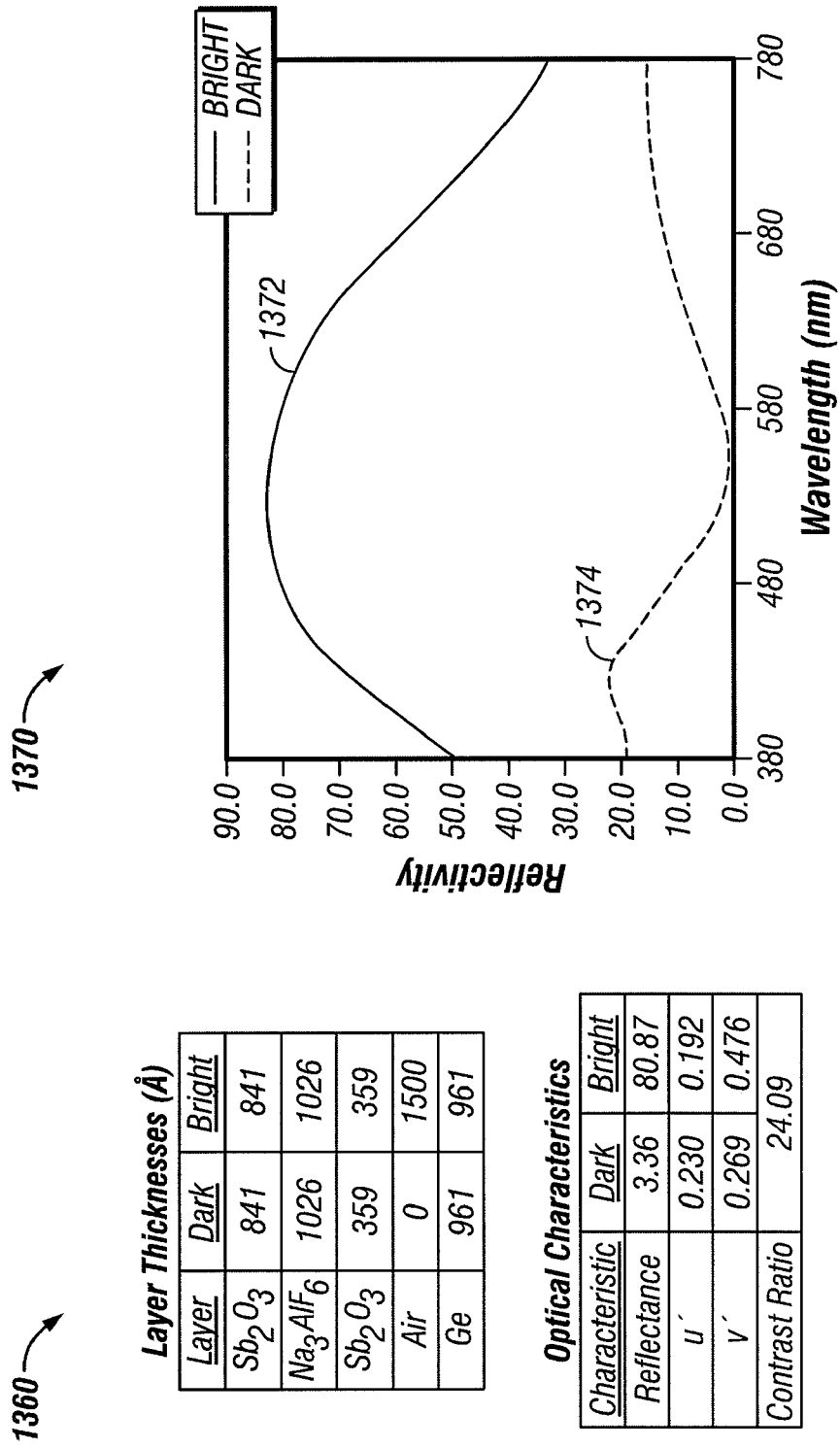
FIG. 13 includes a table and plot summarizing the structural and optical characteristics of an embodiment of the interferometric modulator of FIG. 8.

FIG. 13 illustrates the structure and optical characteristics of another embodiment of the optical device 800. As illustrated in table 1360, in the embodiment illustrated in FIG. 13, the first high-refractive index layer 802 has a thickness of approximately 841 Å and comprises antimony oxide. The low-refractive index layer 804 has a thickness of approximately 1026 Å and comprises cryolite. The second high-refractive index layer has a thickness of approximately 359 Å and comprises antimony oxide. The optical stack 808 is separated from the absorptive layer 810 by an air gap. In the "bright" state, the air gap has a thickness of approximately 1500 Å. The absorptive layer 810 has a thickness of approximately 961 Å and comprises crystalline germanium. In some embodiments the crystalline germanium is backed by a layer of nickel having a thickness of approximately 1000 Å or higher.

The optical device 800 that is illustrated in FIG. 13 has an average reflectance of approximately 80.87% in the "bright" state and approximately 3.36% in the "dark" state. The plot 1370 graphically illustrates the reflectance of the optical device 800 as a function of wavelength. Curve 1372 illustrates the reflectance of the optical device 800 while in the "bright" state, while curve 1374 illustrates the reflectance of the device 800 while in the "dark" state. For the embodiment illustrated in FIG. 13, the contrast ratio of the optical device 800 is approximately 24.09. Table 1360 also includes u' and v' coordinates for both the "dark" and "bright" states. The u' coordinate in the "bright" state is approximately 0.192. The v' coordinate in the "bright" state is approximately 0.476.

Figure 14:
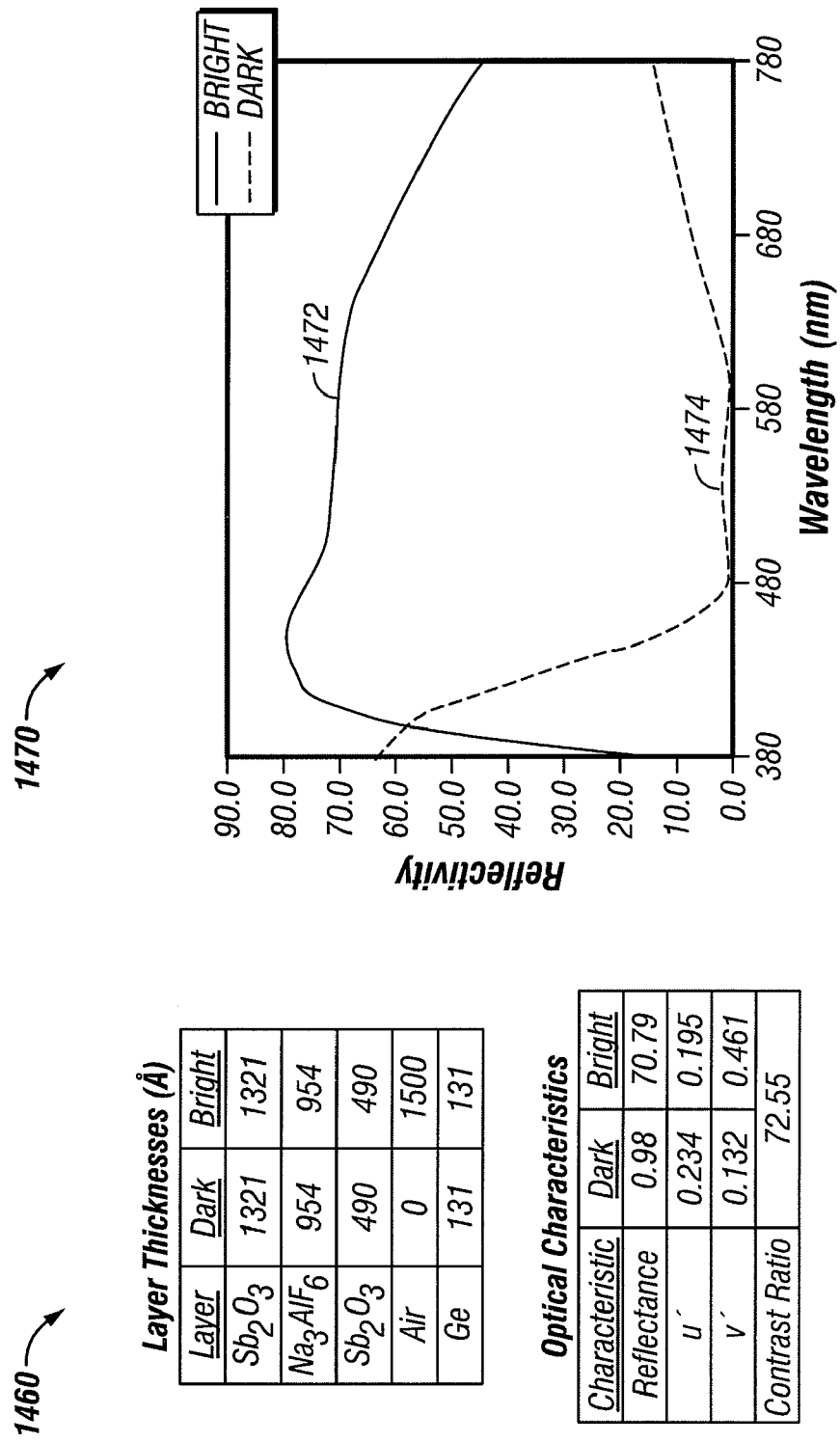
FIG. 14 includes a table and plot summarizing the structural and optical characteristics of an embodiment of the interferometric modulator of FIG. 8.

FIG. 14 illustrates the structure and optical characteristics of another embodiment of the optical device 800. As illustrated in table 1460, in the embodiment illustrated in FIG. 14, the first high-refractive index layer 802 has a thickness of approximately 1321 Å and comprises antimony oxide. The low-refractive index layer 804 has a thickness of approximately 954 Å and comprises cryolite. The second high-refractive index layer has a thickness of approximately 490 Å and comprises antimony oxide. The optical stack 808 is separated from the absorptive layer 810 by an air gap. In the "bright" state, the air gap has a thickness of approximately 1500 Å. The absorptive layer 810 has a thickness of approximately 131 Å and comprises amorphous germanium. In some embodiments the amorphous germanium is backed by a layer of nickel having a thickness of approximately 1000 Å or higher.

The optical device 800 that is illustrated in FIG. 14 has an average reflectance of approximately 70.79% in the "bright" state and approximately 0.98% in the "dark" state. The plot 1470 graphically illustrates the reflectance of the optical device 800 as a function of wavelength. Curve 1472 illustrates the reflectance of the optical device 800 while in the "bright" state, while curve 1474 illustrates the reflectance of the device 800 while in the "dark" state. For the embodiment illustrated in FIG. 14, the contrast ratio of the optical device 800 is approximately 72.55. Table 1460 also includes u' and v' coordinates for both the "dark" and "bright" states. The u' coordinate in the "bright" state is approximately 0.195. The v' coordinate in the "bright" state is approximately 0.461.

Figure 15:
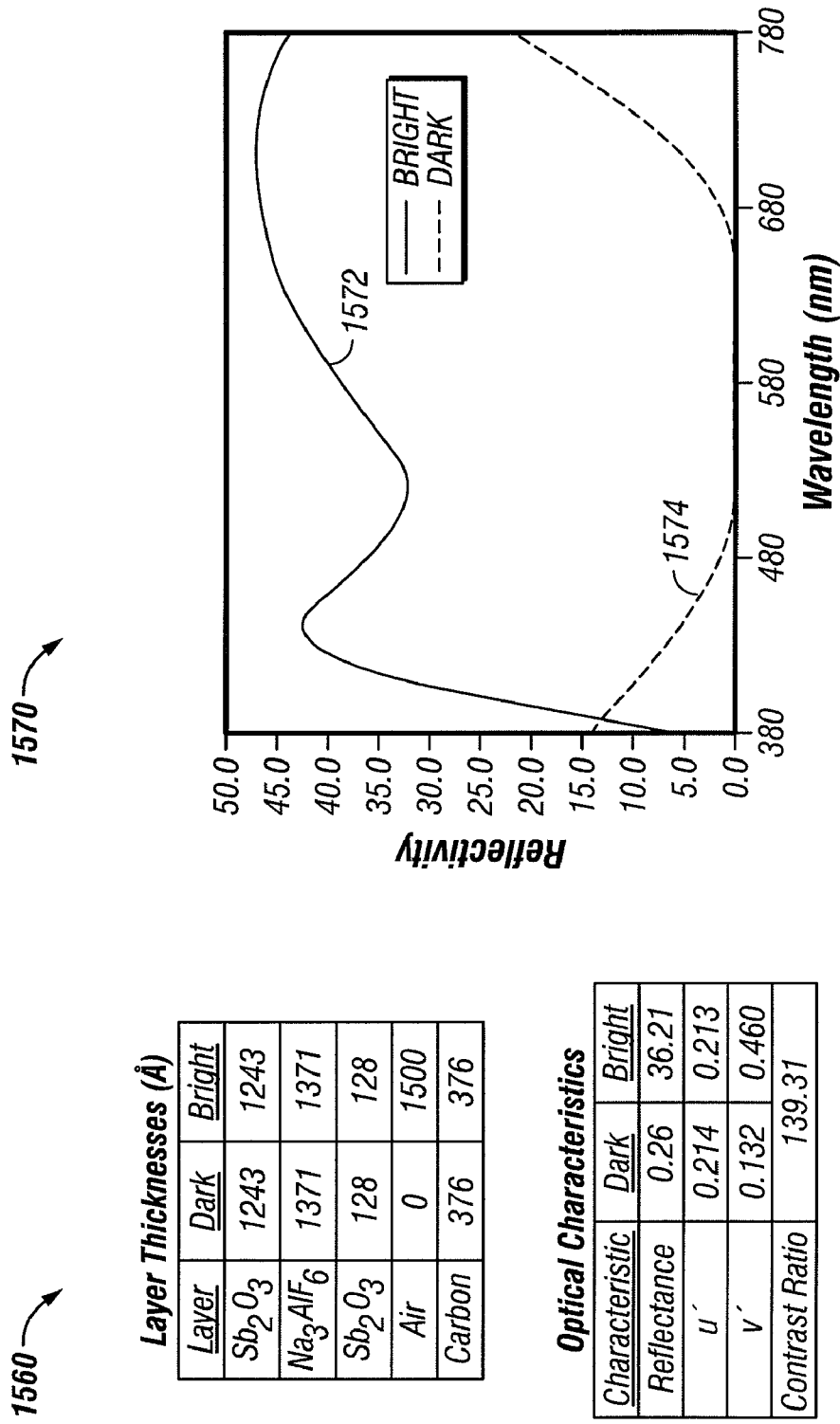
FIG. 15 includes a table and plot summarizing the structural and optical characteristics of an embodiment of the interferometric modulator of FIG. 8.

FIG. 15 illustrates the structure and optical characteristics of another embodiment of the optical device 800. As illustrated in table 1560, in the embodiment illustrated in FIG. 15, the first high-refractive index layer 802 has a thickness of approximately 1243 Å and comprises antimony oxide. The low-refractive index layer 804 has a thickness of approximately 1371 Å and comprises cryolite. The second high-refractive index layer has a thickness of approximately 128 Å and comprises antimony oxide. The optical stack 808 is separated from the absorptive layer 810 by an air gap. In the "bright" state, the air gap has a thickness of approximately 1500 Å. The absorptive layer 810 has a thickness of approximately 376 Å and comprises carbon. In some embodiments the carbon is backed by a layer of nickel having a thickness of approximately 1000 Å or higher.

The optical device 800 that is illustrated in FIG. 15 has an average reflectance of approximately 36.21% in the "bright" state and approximately 0.26% in the "dark" state. The plot 1570 graphically illustrates the reflectance of the optical device 800 as a function of wavelength. Curve 1572 illustrates the reflectance of the optical device 800 while in the "bright" state, while curve 1574 illustrates the reflectance of the device 800 while in the "dark" state. For the embodiment illustrated in FIG. 15, the contrast ratio of the optical device 800 is approximately 139.31. Table 1560 also includes u' and v' coordinates for both the "dark" and "bright" states. The u' coordinate in the "bright" state is approximately 0.213. The v' coordinate in the "bright" state is approximately 0.460.

Figure 16:
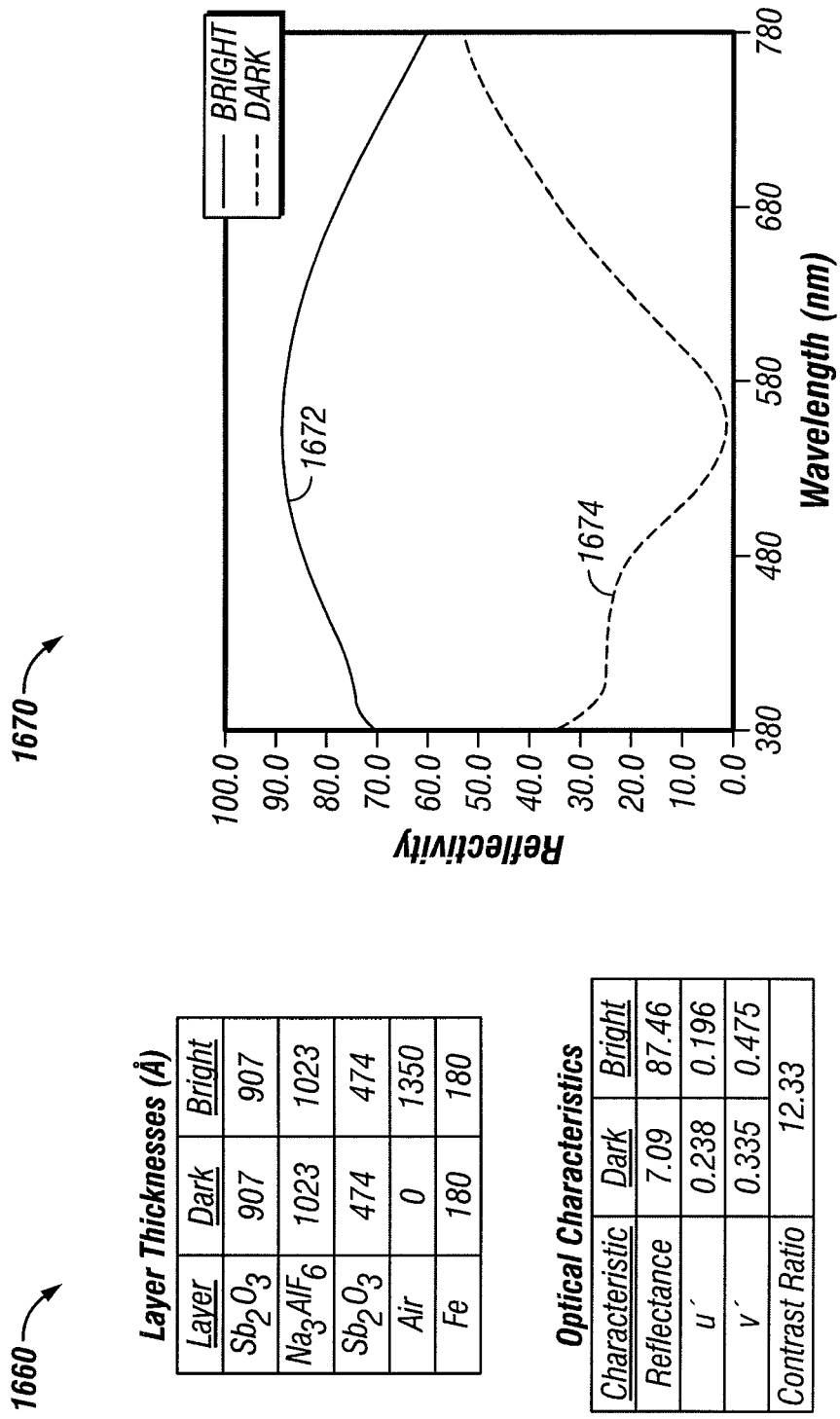
FIG. 16 includes a table and plot summarizing the structural and optical characteristics of an embodiment of the interferometric modulator of FIG. 8.

FIG. 16 illustrates the structure and optical characteristics of another embodiment of the optical device 800. As illustrated in table 1660, in the embodiment illustrated in FIG. 16, the first high-refractive index layer 802 has a thickness of approximately 907 Å and comprises antimony oxide. The low-refractive index layer 804 has a thickness of approximately 1023 Å and comprises cryolite. The second high-refractive index layer has a thickness of approximately 474 Å and comprises antimony oxide. The optical stack 808 is separated from the absorptive layer 810 by an air gap. In the "bright" state, the air gap has a thickness of approximately 1350 Å. The absorptive layer 810 has a thickness of approximately 180 Å and comprises iron. In some embodiments the iron is backed by a layer of nickel having a thickness of approximately 1000 Å or higher.

The optical device 800 that is illustrated in FIG. 16 has an average reflectance of approximately 87.46% in the "bright" state and approximately 7.09% in the "dark" state. The plot 1670 graphically illustrates the reflectance of the optical device 800 as a function of wavelength. Curve 1672 illustrates the reflectance of the optical device 800 while in the "bright" state, while curve 1674 illustrates the reflectance of the device 800 while in the "dark" state. For the embodiment illustrated in FIG. 16, the contrast ratio of the optical device 800 is approximately 12.33. Table 1660 also includes u' and v' coordinates for both the "dark" and "bright" states. The u' coordinate in the "bright" state is approximately 0.196. The v' coordinate in the "bright" state is approximately 0.475.

Figure 17:
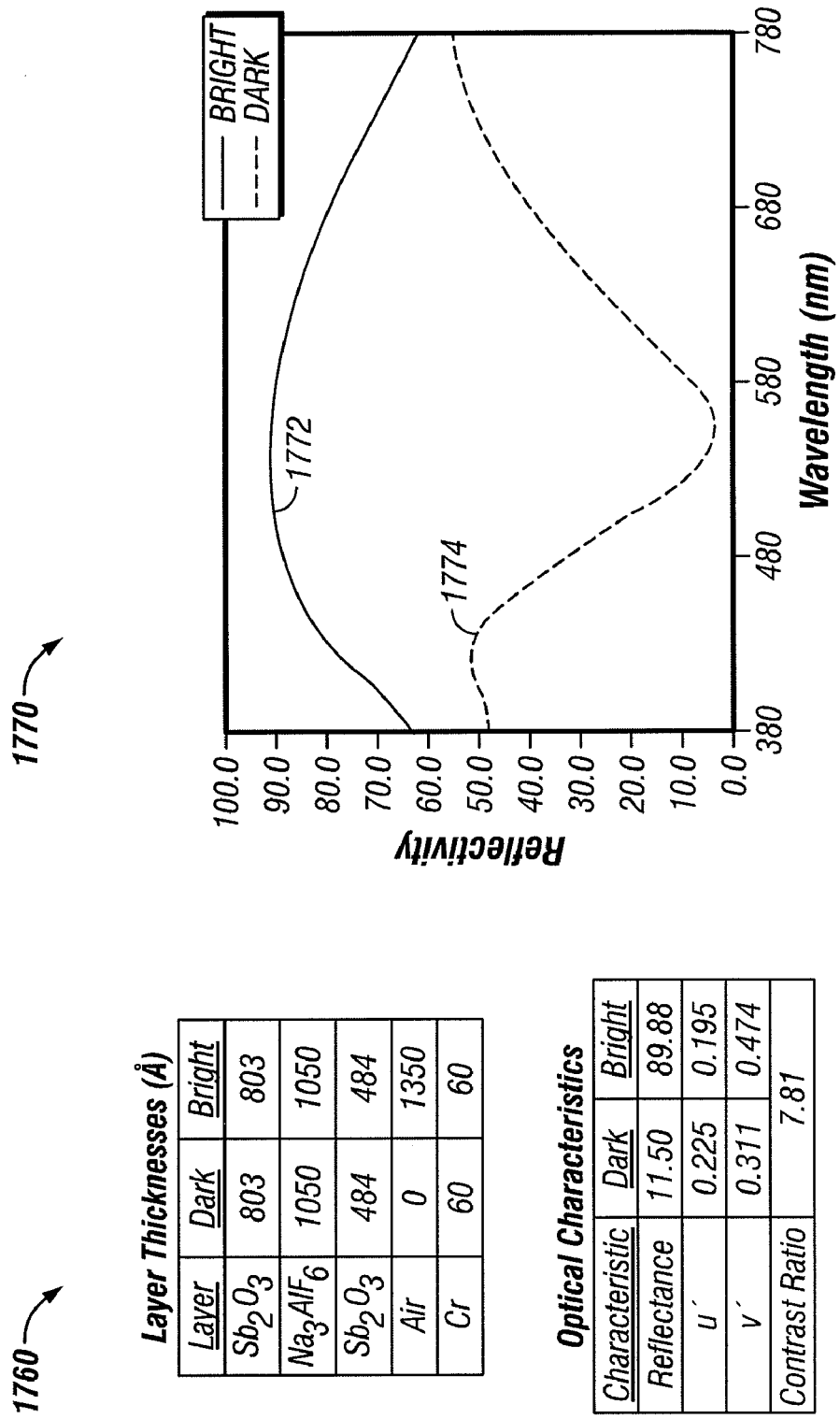
FIG. 17 includes a table and plot summarizing the structural and optical characteristics of an embodiment of the interferometric modulator of FIG. 8.

FIG. 17 illustrates the structure and optical characteristics of another embodiment of the optical device 800. As illustrated in table 1760, in the embodiment illustrated in FIG. 17, the first high-refractive index layer 802 has a thickness of approximately 803 Å and comprises antimony oxide. The low-refractive index layer 804 has a thickness of approximately 1050 Å and comprises cryolite. The second high-refractive index layer has a thickness of approximately 484 Å and comprises antimony oxide. The optical stack 808 is separated from the absorptive layer 810 by an air gap. In the "bright" state, the air gap has a thickness of approximately 1350 Å. The absorptive layer 810 has a thickness of approximately 60 Å and comprises chromium. In some embodiments the chromium is backed by a layer of nickel having a thickness of approximately 1000 Å or higher.

The optical device 800 that is illustrated in FIG. 17 has an average reflectance of approximately 89.88% in the "bright" state and approximately 11.50% in the "dark" state. The plot 1770 graphically illustrates the reflectance of the optical device 800 as a function of wavelength. Curve 1772 illustrates the reflectance of the optical device 800 while in the "bright" state, while curve 1774 illustrates the reflectance of the device 800 while in the "dark" state. For the embodiment illustrated in FIG. 17, the contrast ratio of the optical device 800 is approximately 7.81. Table 1760 also includes u' and v' coordinates for both the "dark" and "bright" states. The u' coordinate in the "bright" state is approximately 0.195. The v' coordinate in the "bright" state is approximately 0.474.

Figure 18:
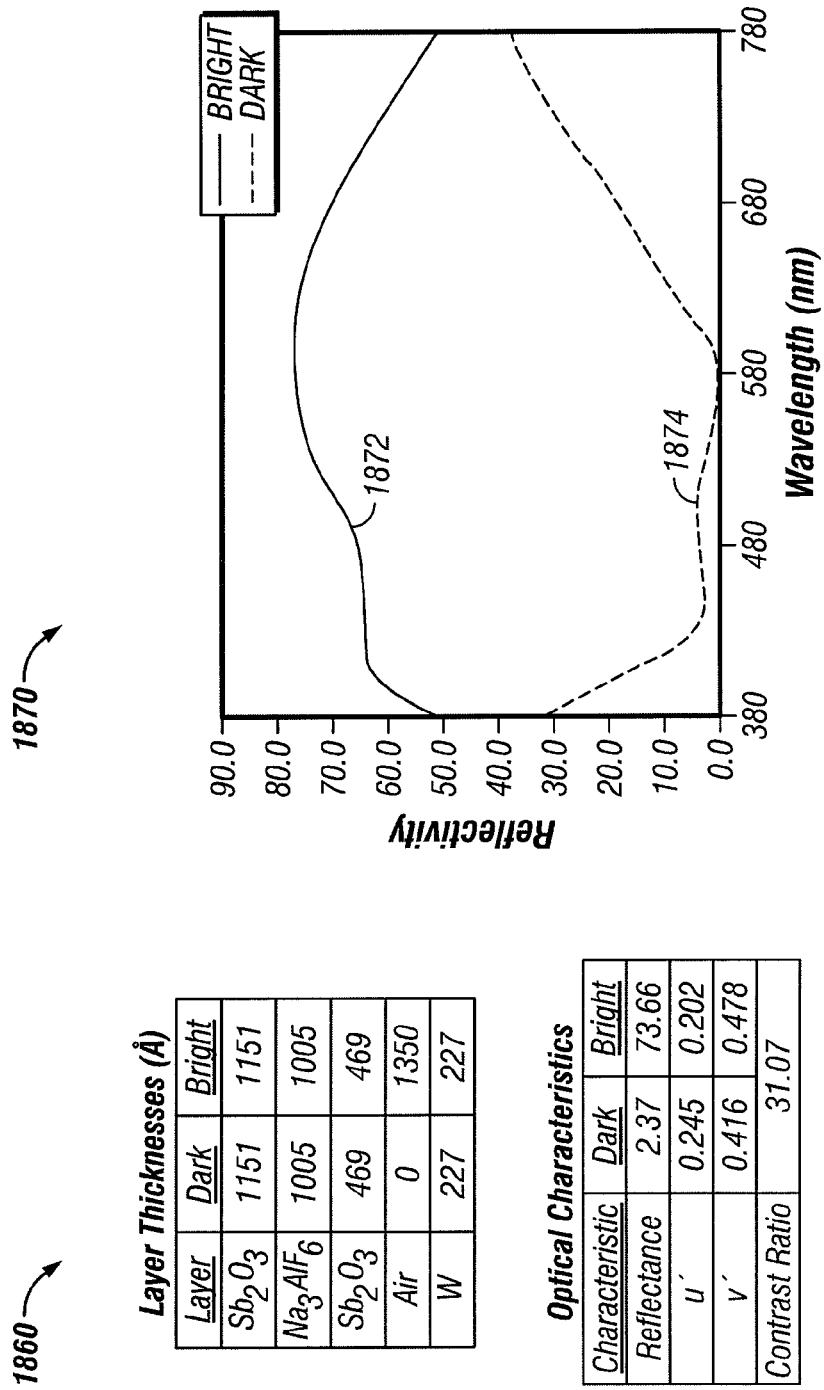
FIG. 18 includes a table and plot summarizing the structural and optical characteristics of an embodiment of the interferometric modulator of FIG. 8.

FIG. 18 illustrates the structure and optical characteristics of another embodiment of the optical device 800. As illustrated in table 1860, in the embodiment illustrated in FIG. 18, the first high-refractive index layer 802 has a thickness of approximately 1151 Å and comprises antimony oxide. The low-refractive index layer 804 has a thickness of approximately 1005 Å and comprises cryolite. The second high-refractive index layer has a thickness of approximately 469 Å and comprises antimony oxide. The optical stack 808 is separated from the absorptive layer 810 by an air gap. In the "bright" state, the air gap has a thickness of approximately 1350 Å. The absorptive layer 810 has a thickness of approximately 227 Å and comprises tungsten. In some embodiments the tungsten is backed by a layer of nickel having a thickness of approximately 1000 Å or higher.

The optical device 800 that is illustrated in FIG. 18 has an average reflectance of approximately 73.66% in the "bright" state and approximately 2.37% in the "dark" state. The plot 1870 graphically illustrates the reflectance of the optical device 800 as a function of wavelength. Curve 1872 illustrates the reflectance of the optical device 800 while in the "bright" state, while curve 1874 illustrates the reflectance of the device 800 while in the "dark" state. For the embodiment illustrated in FIG. 18, the contrast ratio of the optical device 800 is approximately 31.07. Table 1860 also includes u' and v' coordinates for both the "dark" and "bright" states. The u' coordinate in the "bright" state is approximately 0.202. The v' coordinate in the "bright" state is approximately 0.478.

Figure 19:
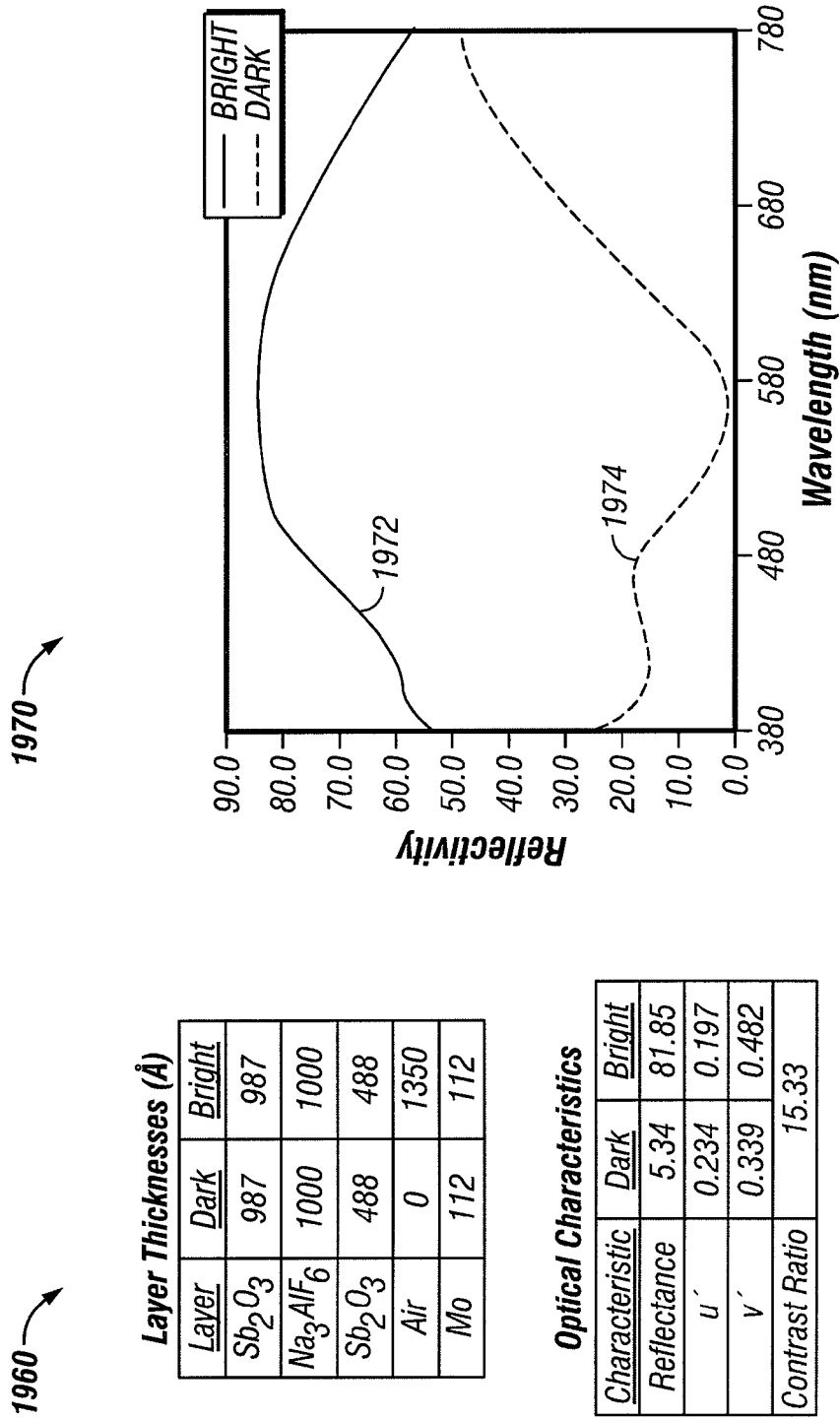
FIG. 19 includes a table and plot summarizing the structural and optical characteristics of an embodiment of the interferometric modulator of FIG. 8.

FIG. 19 illustrates the structure and optical characteristics of another embodiment of the optical device 800. As illustrated in table 1960, in the embodiment illustrated in FIG. 19, the first high-refractive index layer 802 has a thickness of approximately 987 Å and comprises antimony oxide. The low-refractive index layer 804 has a thickness of approximately 1000 Å and comprises cryolite. The second high-refractive index layer has a thickness of approximately 488 Å and comprises antimony oxide. The optical stack 808 is separated from the absorptive layer 810 by an air gap. In the "bright" state, the air gap has a thickness of approximately 1350 Å. The absorptive layer 810 has a thickness of approximately 112 Å and comprises molybdenum. In some embodiments the molybdenum is backed by a layer of nickel having a thickness of approximately 1000 Å or higher.

The optical device 800 that is illustrated in FIG. 19 has an average reflectance of approximately 81.85% in the "bright" state and approximately 5.34% in the "dark" state. The plot 1970 graphically illustrates the reflectance of the optical device 800 as a function of wavelength. Curve 1972 illustrates the reflectance of the optical device 800 while in the "bright" state, while curve 1974 illustrates the reflectance of the device 800 while in the "dark" state. For the embodiment illustrated in FIG. 19, the contrast ratio of the optical device 800 is approximately 15.33. Table 1960 also includes u' and v' coordinates for both the "dark" and "bright" states. The u' coordinate in the "bright" state is approximately 0.197. The v' coordinate in the "bright" state is approximately 0.482.

With any of the above-described embodiments, the optical device 800 can be fabricated using techniques, such as photolithography, which are known in the art. With respect to FIG. 8, for example, a substrate 820 can be provided. An optical stack 808 can then be formed upon the substrate 820. In some embodiments, formation of the optical stack 808 comprises forming the first high-refractive index layer 802 on the substrate 820, forming the low-refractive index layer 804 over the first high-refractive index layer 802, and forming the second high-refractive index layer 806 over the low-refractive index layer 804. The perimeter wall 818, or other type of support structure, can be formed, for example, on or around the optical stack 808. The optically absorptive layer 810 can be formed spaced apart from the optical stack 808. This can be done, for example, by forming a sacrificial layer (not shown) over the optical stack, forming the optically absorptive layer 810 over the sacrificial layer, and then removing the sacrificial layer.

A plurality of optical devices 800 can be formed on the substrate 820 to create displays which incorporate a plurality of pixels. For example, a plurality of optical devices 800 can be provided upon a substrate 820 to create a monochrome, black and white display. A plurality of optical devices 800 can also be used in other types of displays, such as red green blue white (RGBW) displays.

Various specific embodiments have been described in connection with the accompanying drawings. However, a wide variety of variation is possible. Components and/or elements may be added, removed, or rearranged. Additionally, processing steps may be added, removed, or reordered. While only a few embodiments have been explicitly described, other embodiments will become apparent to those of ordinary skill in the art based on this disclosure. Therefore, the scope of the invention is intended to be defined by reference to the appended claims and not simply with regard to the explicitly described embodiments.

What is claimed is:

1. An optical device comprising:
   an optical stack comprising:
      a first layer having a first refractive index, the first layer having a thickness in a range between about 700 angstroms and about 1350 angstroms;
      a second layer over the first layer, the second layer having a second refractive index less than the first refractive index, the second layer having a thickness in a range between about 900 angstroms and about 1400 angstroms; and
      a third layer over the second layer, the third layer having a third refractive index larger than the second refractive index; and
   a fourth layer that is at least partially optically absorptive, wherein the optical stack and the fourth layer are a first distance from one another when the device is in a first state and are a second distance from one another when the device is in a second state, the first distance different from the second distance.

2. The optical device of claim 1, wherein at least one of the first layer and the third layer includes two or more sub-layers.

3. The optical device of claim 2, wherein one of the sub-layers has a fourth refractive index greater than the second refractive index.

4. The optical device of claim 2, wherein one of the sub-layers is electrically conductive.

5. The optical device of claim 1, wherein a region between the optical stack and the at least partially optically absorptive layer has a fifth refractive index that is less than the third refractive index.

6. The optical device of claim 1, wherein at least one of the first layer and the third layer is electrically conductive.

7. The optical device of claim 1, wherein the first refractive index and the third refractive index are both greater than about 1.7.

8. The optical device of claim 1, wherein the second refractive index is less than about 1.5.

9. The optical device of claim 1, wherein the first layer or third layer includes indium tin oxide, silicon nitride, titanium oxide, zirconium oxide, yttrium oxide, antimony oxide, or zinc selenide.

10. The optical device of claim 1, wherein the second layer includes cryolite, magnesium fluoride, or fluorinated $SiO_x$.

11. The optical device of claim 1, wherein the fourth layer includes molybdenum, nickel, silicon, $TiN_xW_y$, titanium nitride, germanium, carbon, iron, chromium, tungsten, $Si_xGe_{1-x}$, or tin nitride.

12. The optical device of claim 1, wherein the third layer has a thickness in a range between about 100 angstroms and about 550 angstroms.

13. The optical device of claim 1, wherein the fourth layer has a thickness in a range between about 30 angstroms and about 3000 angstroms.

14. The optical device of claim 1, wherein the first distance is in a range between about 1300 Å and about 2300 Å or between about 3000 Å and 4500 Å.

15. The optical device of claim 1, wherein the second distance is approximately zero.

16. The optical device of claim 1, wherein the optical device in the first state has a first reflectance and the optical device in the second state has a second reflectance, the ratio of the first reflectance to the second reflectance of the optical device being greater than about ten.

17. The optical device of claim 16, wherein the ratio is greater than about one hundred.

18. The optical device of claim 1, wherein the optical device in the first state has a reflected spectral power distribution of visible light which substantially corresponds to the standard white point D65.

19. The optical device of claim 1, wherein the fourth layer is mounted on a mechanical support layer.

20. The optical device of claim 19, wherein the mechanical support layer includes nickel.

21. The optical device of claim 1, wherein the optical stack is mounted on an at least partially optically transmissive substrate.

22. The optical device of claim 21, wherein the at least partially optically transmissive substrate includes glass.

23. The optical device of claim 1, wherein the optical device is included in a pixel in a display, and further comprising
   a processor that is configured to communicate with said display, said processor being configured to process image data; and
   a memory device that is configured to communicate with said processor.

24. The optical device of claim 23, further comprising a driver circuit configured to send at least one signal to said display.

25. The optical device of claim 24, further comprising a controller configured to send at least a portion of said image data to said driver circuit.

26. The optical device of claim 23, further comprising an image source module configured to send said image data to said processor.

27. The optical device of claim 26, wherein said image source module includes at least one of a receiver, transceiver, and transmitter.

28. The optical device of claim 23, further comprising an input device configured to receive input data and to communicate said input data to said processor.

29. An optical device comprising:
- first means for reflecting and transmitting light, the first means having a first refractive index, the first means having a thickness in a range between about 700 angstroms and about 1350 angstroms;
- second means for reflecting and transmitting light, the second means over the first means, the second means having a second refractive index less than the first refractive index, the second means having a thickness in a range between about 900 angstroms and about 1400 angstroms; and
- third means for reflecting and transmitting light, the third means over the second means, the third means having a third refractive index larger than the second refractive index; and
- fourth means for reflecting and absorbing light, wherein the third means and the fourth means are a first distance from one another when the device is in a first state and are a second distance from one another when the device is in a second state, the first distance different from the second distance.

30. The optical device of claim 29, wherein the first means includes layer of material having the first refractive index, the second means includes a layer of material having the second refractive index, and third means includes a layer of material having the third refractive index.

31. The optical device of claim 29, wherein the fourth means includes a layer of at least partially optically absorptive material.

* * * * *